(12) United States Patent
Hakamata et al.

(10) Patent No.: US 12,109,752 B2
(45) Date of Patent: Oct. 8, 2024

(54) COMPOSITION FOR FORMING UNDERLAYER FILM IN IMPRINTING METHOD, KIT, PATTERN PRODUCING METHOD, LAMINATE, AND METHOD FOR MANUFACTURING SEMICONDUCTOR ELEMENT

(71) Applicant: FUJIFILM Corporation, Tokyo (JP)

(72) Inventors: Akihiro Hakamata, Haibara-gun (JP); Naoya Shimoju, Haibara-gun (JP); Yuichiro Goto, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 462 days.

(21) Appl. No.: 17/484,492

(22) Filed: Sep. 24, 2021

(65) Prior Publication Data
US 2022/0009152 A1   Jan. 13, 2022

Related U.S. Application Data

(63) Continuation of application No. PCT/JP2020/012596, filed on Mar. 23, 2020.

(30) Foreign Application Priority Data

Mar. 29, 2019   (JP) ................... 2019-067816

(51) Int. Cl.
*B29C 59/02*   (2006.01)
*C08F 2/50*    (2006.01)
(Continued)

(52) U.S. Cl.
CPC ............... *B29C 59/02* (2013.01); *C08F 2/50* (2013.01); *C08F 220/10* (2013.01);
(Continued)

(58) Field of Classification Search
CPC ............... G03F 7/0002; B29C 59/02
See application file for complete search history.

(56) References Cited

U.S. PATENT DOCUMENTS

| | | | |
|---|---|---|---|
| 2014/0220353 | A1 | 8/2014 | Kodama et al. |
| 2015/0079793 | A1 | 3/2015 | Hattori et al. |

(Continued)

FOREIGN PATENT DOCUMENTS

| | | | |
|---|---|---|---|
| JP | 2005-533393 | A | 11/2005 |
| JP | 2013-093552 | A | 5/2013 |

(Continued)

OTHER PUBLICATIONS

English translation of WO2018051961. (Year: 2018).*
(Continued)

*Primary Examiner* — Chanceity N Robinson
*Assistant Examiner* — Anna Malloy
(74) *Attorney, Agent, or Firm* — Sughrue Mion, PLLC

(57) ABSTRACT

A composition for forming an underlayer film in an imprinting method, which includes a high-molecular-weight compound having a polymerizable functional group and a monomer having a plurality of crosslinking functional groups capable of being bonded to the polymerizable functional group, and in which a Hansen solubility parameter distance, which is a difference between a Hansen solubility parameter of the high-molecular-weight compound and a Hansen solubility parameter of the monomer, is 5.0 or less, and regarding the two crosslinking functional groups among the plurality of crosslinking functional groups, the number of atoms, which constitute a shortest atom chain mutually linking crosslinking points in the respective crosslinking functional groups, is 7 or more; a laminate including a layer formed of the composition for forming an underlayer film; and a method for manufacturing a semiconductor element, in
(Continued)

which a semiconductor element is manufactured using a pattern obtained by a pattern producing method.

18 Claims, 1 Drawing Sheet

(51) Int. Cl.
　　*C08F 220/10*　　(2006.01)
　　*G03F 7/00*　　(2006.01)
　　*G03F 7/004*　　(2006.01)
　　*G03F 7/20*　　(2006.01)

(52) U.S. Cl.
　　CPC .......... *G03F 7/0002* (2013.01); *G03F 7/0045* (2013.01); *G03F 7/0046* (2013.01); *G03F 7/2004* (2013.01); *G03F 7/2018* (2013.01)

(56) References Cited

U.S. PATENT DOCUMENTS

| | | |
|---|---|---|
| 2015/0228498 A1 | 8/2015 | Hattori et al. |
| 2017/0285465 A1 | 10/2017 | Iimura et al. |
| 2017/0335150 A1 | 11/2017 | Wan et al. |
| 2020/0109305 A1 | 4/2020 | Goto et al. |
| 2020/0409488 A1 * | 12/2020 | Narita .................. C08F 220/56 |

FOREIGN PATENT DOCUMENTS

| | | | |
|---|---|---|---|
| JP | 2014-093385 A | 5/2014 | |
| JP | 2016-146468 A | 8/2016 | |
| JP | 2017-206695 A | 11/2017 | |
| WO | 2013/191118 A1 | 12/2013 | |
| WO | 2017/170697 A1 | 10/2017 | |
| WO | WO-2018051961 A1 * | 3/2018 | ............ B29C 59/02 |
| WO | 2018/230488 A1 | 12/2018 | |
| WO | WO-2019187644 A1 * | 10/2019 | ............ C08F 220/56 |

OTHER PUBLICATIONS

International Preliminary Report on Patentability dated Sep. 28, 2021 in International Application No. PCT/JP2020/012596.
Written Opinion of the International Searching Authority dated Jun. 16, 2020 in International Application No. PCT/JP2020/012596.
International Search Report dated Jun. 16, 2020 in International Application No. PCT/JP2020/012596.

* cited by examiner

COMPOSITION FOR FORMING UNDERLAYER FILM IN IMPRINTING METHOD, KIT, PATTERN PRODUCING METHOD, LAMINATE, AND METHOD FOR MANUFACTURING SEMICONDUCTOR ELEMENT

CROSS-REFERENCE TO RELATED APPLICATIONS

This application is a Continuation of PCT International Application No. PCT/JP2020/012596 filed on Mar. 23, 2020, which claims priority under 35 U.S.C § 119(a) to Japanese Patent Application No. 2019-067816 filed on Mar. 29, 2019. Each of the above application(s) is hereby expressly incorporated by reference, in its entirety, into the present application.

BACKGROUND OF THE INVENTION

1. Field of the Invention

The present invention relates to a composition for forming an underlayer film in an imprinting method, and further relates to a kit to which this composition is applied, a pattern producing method, a laminate, and a method for manufacturing a semiconductor element.

2. Description of the Related Art

An imprinting method is a technique in which a fine pattern is transferred to a plastic material by pressing a metal mold (generally also called a mold or a stamper) on which a pattern is formed. The imprinting method enables simple and precise production of a fine pattern, and thus is expected to be applied in various fields in recent years. In particular, a nanoimprint technique for forming a fine pattern of a nano-order level is attracting attention.

The imprinting method is roughly classified into a thermal imprinting method and an optical imprinting method according to a transfer method thereof. In the thermal imprinting method, a mold is pressed against a thermoplastic resin heated to a temperature equal to or higher than a glass transition temperature (hereinafter, referred to as a "Tg" in some cases), the thermoplastic resin is cooled, and then the mold is released to form a fine pattern. This method has an advantage that various materials can be selected, but also has problems in that a high pressure is required during pressing, and as the pattern size is finer, the dimensional accuracy is more likely to be reduced due to thermal shrinkage or the like. Meanwhile, in the optical imprinting method, after photocuring is performed in a state where a mold is pressed against a photocurable composition for forming a pattern, the mold is released. In this method, high-pressure application or high-temperature heating is not required, a dimensional change before and after curing is small, and thus there is an advantage that a fine pattern can be formed with high accuracy.

Recently, new developments such as a nanocasting method in which the advantages of both the thermal imprinting method and the optical imprinting method are combined, and a reversal imprinting method for producing a three-dimensional laminated structure have also been reported.

In the optical imprinting method, a composition for forming a pattern is applied onto a substrate, and then a mold made of a light-transmitting material such as quartz is pressed (JP2005-533393A). The composition for forming a pattern is cured by light irradiation in a state where the mold is pressed, and then the mold is released to produce a cured substance to which a desired pattern is transferred.

In such an imprinting method, the mold is released from the composition for forming a pattern, and thus sufficient adhesiveness between a substrate and the composition for forming a pattern is required. Accordingly, for example, as shown in JP2013-093552A, JP2014-093385A, JP2016-146468A, and JP2017-206695A, a technique for providing, between a substrate and a composition for forming a pattern, an underlayer film for improving the adhesiveness between the substrate and the composition for forming a pattern has been proposed.

SUMMARY OF THE INVENTION

It is known that an underlayer film is formed of a composition containing a crosslinking agent (for example, methylol melamine or the like, JP2017-206695A) consisting of a low-molecular-weight compound in addition to a high-molecular-weight compound such as a resin, in order to improve the adhesiveness of the underlayer film.

However, it was found that in the formation of the underlayer film, in a case where the composition for forming an underlayer film, which contains the high-molecular-weight compound and the crosslinking agent consisting of the low-molecular-weight compound as described above, is applied, the film hardness of the cured underlayer film may be decreased. In a case where the mold is released from the composition for forming a pattern on the underlayer film, the low film hardness of the underlayer film is more likely to cause aggregation breakage of the underlayer film, and thus releasability may also be degraded.

The present invention has been made in consideration of the aforementioned problems, and an object of the present invention is to provide a composition for forming an underlayer film from which an underlayer film having excellent film hardness can be formed even in a case where the composition for forming an underlayer film contains a high-molecular-weight compound and a crosslinking agent consisting of a low-molecular-weight compound.

Moreover, another object of the present invention is to provide a kit including the composition for forming an underlayer film, and a pattern producing method using the composition for forming an underlayer film. Furthermore, still another object of the present invention is to provide a laminate including a layer formed of the composition for forming an underlayer film, and a method for manufacturing a semiconductor element, in which a semiconductor element is manufactured using a pattern obtained by the pattern producing method.

The aforementioned problems can be solved by using, as a monomer, a compound which has high compatibility with a macromolecule and is capable of efficiently forming a crosslink. Specifically, the aforementioned problems can be solved by the following unit <1> and preferably by a unit <2> and subsequent units.

<1>

A composition for forming an underlayer film in an imprinting method, comprising:
 a high-molecular-weight compound having a polymerizable functional group; and
 a monomer having a plurality of crosslinking functional groups capable of being bonded to the polymerizable functional group,
 wherein a Hansen solubility parameter distance, which is a difference between a Hansen solubility parameter of the high-molecular-weight compound and a Hansen solubility parameter of the monomer, is 5.0 or less, and regarding the two crosslinking functional groups among the plurality of crosslinking functional groups, the number of atoms, which constitute a shortest atom chain mutually linking crosslinking points in the respective crosslinking functional groups, is 7 or more.

<2>

The composition for forming an underlayer film as described in <1>, in which at least one kind of the high-molecular-weight compound or the monomer has a ring structure.

<3>

The composition for forming an underlayer film as described in <2>, in which both the high-molecular-weight compound and the monomer have a ring structure.

<4>

The composition for forming an underlayer film as described in <2> or <3>, in which the ring structure contains an aromatic ring.

<5>

The composition for forming an underlayer film as described in any one of <1> to <4>, in which the Hansen solubility parameter distance is 3 or less.

<6>

The composition for forming an underlayer film as described in any one of <1> to <5>, in which the number of atoms constituting the atom chain is 20 or less.

<7>

The composition for forming an underlayer film as described in any one of <1> to <6>, in which at least one kind of the polymerizable functional group or the crosslinking functional group includes a group having an ethylenically unsaturated bond.

<8>

The composition for forming an underlayer film as described in any one of <1> to <7>, in which at least one kind of the high-molecular-weight compound or the monomer contains a hydrogen bonding group.

<9>

The composition for forming an underlayer film as described in any one of <1> to <8>, further comprising a solvent,
  in which a content of the solvent with respect to the composition for forming an underlayer film is 99% by mass or greater.

<10>

The composition for forming an underlayer film as described in any one of <1> to <9>, in which a molecular weight of the monomer is 200 to 1,000.

<11>

The composition for forming an underlayer film as described in any one of <1> to <10>, in which the high-molecular-weight compound includes at least one kind of an acrylic resin, a novolac resin, or a vinyl resin.

<12>

A kit for imprinting, comprising a combination of the composition for forming an underlayer film as described in any one of <1> to <11> and a composition for forming a pattern.

<13>

A pattern producing method comprising:
  forming an underlayer film on a substrate by using the composition for forming an underlayer film as described in any one of <1> to <11>;
  applying a composition for forming a pattern onto the underlayer film;
  curing the composition for forming a pattern in a state of being in contact with a mold; and
  peeling off the mold from the composition for forming a pattern.

<14>

The pattern producing method as described in <13>, in which a contact angle of the substrate to pure water is 60 degrees or larger.

<15>

The pattern producing method as described in <13> or <14>, in which the forming of the underlayer film includes applying the composition for forming an underlayer film onto the substrate by a spin coating method.

<16>

The pattern producing method as described in any one of <13> to <15>, in which the applying of the composition for forming a pattern onto the underlayer film is performed by an ink jet method.

<17>

A laminate comprising:
  a substrate; and
  a layer formed of the composition for forming an underlayer film as described in any one of <1> to <11>.

<18>

A method for manufacturing a semiconductor element, in which a semiconductor element is manufactured using a pattern obtained by the producing method as described in any one of <13> to <16>.

With the composition for forming an underlayer film according to an aspect of the present invention, an underlayer film having excellent film hardness can be obtained even in a case where the composition for forming an underlayer film contains a high-molecular-weight compound and a crosslinking agent consisting of a low-molecular-weight compound. Moreover, with the composition for forming an underlayer film according to the aspect of the present invention, it is possible to provide the kit, the pattern producing method, the laminate, and the method for manufacturing a semiconductor element according to the aspect of the present invention.

DESCRIPTION OF THE PREFERRED EMBODIMENTS

Figure 1A:
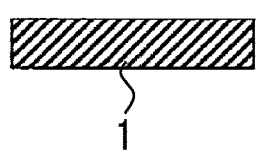
FIGS. 1A to 1G are schematic cross-sectional diagrams showing steps of imprinting.

Hereinafter, representative embodiments of the present invention will be described. Respective constituent elements will be described based on the representative embodiments for convenience, but the present invention is not limited to such embodiments.

In the present specification, a numerical range expressed using the term "to" means a range which includes the preceding and succeeding numerical values of "to" as a lower limit value and an upper limit value, respectively.

In the present specification, the term "step" is meant to include not only an independent step, but also a step which cannot be clearly distinguished from other steps as long as an intended action of the step is achieved.

In the description of a group (atomic group) in the present specification, in a case where the group is described without specifying whether the group is substituted or unsubstituted, the description means that the group includes both a group having no substituent and a group having a substituent. For example, in a case where a group is simply described as an "alkyl group", the description means that the alkyl group includes both an alkyl group having no substituent (unsubstituted alkyl group) and an alkyl group having a substituent (substituted alkyl group). Moreover, in a case where a group is simply described as an "alkyl group", the description means that the alkyl group may be chain-like or cyclic, and may be linear or branched in a case where the alkyl group is chain-like.

In the present specification, unless otherwise specified, "exposure" is meant to include not only drawing using light but also drawing using particle rays such as electron beams and ion beams. Examples of energy rays used for the drawing include actinic rays such as a bright line spectrum of a mercury lamp, far ultraviolet rays typified by an excimer laser, extreme ultraviolet rays (EUV light), and X-rays, and particle rays such as electron beams and ion beams.

In the present specification, "light" includes not only light having a wavelength in an ultraviolet, near-ultraviolet, far-ultraviolet, visible, or infrared range, or an electromagnetic wave but also a radiation. Examples of the radiation include microwaves, electron beams, extreme ultraviolet rays (EUV), and X-rays. Moreover, laser light such as a 248-nm excimer laser, a 193-nm excimer laser, and a 172-nm excimer laser can also be used. The light may be monochromatic light (single-wavelength light) passing through an optical filter, or may be light (composite light) having a plurality of wavelengths.

In the present specification, "(meth)acrylate" means both "acrylate" and "methacrylate" or either of them, "(meth)acryl" means both "acryl" and "methacryl" or either of them, and "(meth)acryloyl" means both "acryloyl" and "methacryloyl" or either of them.

In the present specification, a solid content in a composition means components other than the solvent, and a content (concentration) of the solid content in the composition is represented by the mass percentage of the components other than the solvent with respect to the total mass of the composition.

In the present specification, a temperature is 23° C. and an atmospheric pressure is 101,325 Pa (1 atm), unless otherwise specified.

In the present specification, a weight-average molecular weight (Mw) and a number-average molecular weight (Mn) are each expressed as a value in terms of polystyrene according to gel permeation chromatography (GPC measurement), unless otherwise specified. The weight-average molecular weight (Mw) and the number-average molecular weight (Mn) can be determined, for example, by using HLC-8220 (manufactured by TOSOH CORPORATION), and, as columns, GUARD COLUMN HZ-L, TSKgel Super HZM-M, TSKgel Super HZ4000, TSKgel Super HZ3000, and TSKgel Super HZ2000 (manufactured by TOSOH CORPORATION). Moreover, the measurement is performed using tetrahydrofuran (THF) as an eluent, unless otherwise specified. Furthermore, for the detection in the GPC measurement, a detector of ultraviolet rays (UV rays) having a wavelength of 254 nm is used, unless otherwise specified.

In the present specification, regarding a positional relationship of respective layers constituting a laminate, in a case where there is a description of "upper" or "lower", another layer may be on an upper side or a lower side of a reference layer among a plurality of layers of interest. That is, a third layer or element may be further interposed between the reference layer and the other layer, and the reference layer and the other layer are not necessary to be in contact with each other. Moreover, unless otherwise specified, in a case where a direction in which layers are stacked on a substrate is referred to as "upward" or there is a photosensitive layer, a direction from the substrate to the photosensitive layer is referred to as "upward", and the opposite direction is referred to as "downward". Furthermore, such setting of upward and downward directions is for convenience in the present specification, and in a practical aspect, the "upward" direction in the present specification may be different from a vertically upward direction.

In the present specification, "imprint" preferably refers to transfer of a pattern with a size of 1 nm to 10 mm, and more preferably refers to transfer (nanoimprint) of a pattern with a size of about 10 nm to 100 μm.

<Composition for Forming Underlayer Film>

A composition for forming an underlayer film in an imprinting method according to an embodiment of the present invention contains a high-molecular-weight compound having a polymerizable functional group (hereinafter, also referred to as a "polymerizable group"), and a monomer (hereinafter, also referred to as a "crosslinkable monomer") having a plurality of crosslinking functional groups (hereinafter, also referred to as "crosslinkable groups") capable of being bonded to the polymerizable functional group. Moreover, in the composition for forming an underlayer film according to the embodiment of the present invention, a Hansen solubility parameter distance ($\Delta$HSP), which is a difference between a Hansen solubility parameter of the high-molecular-weight compound and a Hansen solubility parameter of the crosslinkable monomer, is 5.0 or less, and regarding two crosslinkable groups among the plurality of crosslinkable groups, the number (hereinafter, also referred to as a "distance between crosslinking points") of atoms, which constitute a shortest atom chain mutually linking crosslinking points in the respective crosslinkable groups, is 7 or more.

With the composition for forming an underlayer film according to the embodiment of the present invention, an underlayer film having excellent film hardness can be obtained even in a case where the composition for forming an underlayer film contains a high-molecular-weight compound and a crosslinking agent consisting of a low-molecular-weight compound. The reason for that is not clear, but it is presumed as follows.

The composition for forming an underlayer film according to the embodiment of the present invention has a $\Delta$HSP of 5.0 or less, and contains a crosslinkable monomer having a distance between crosslinking points of 7 or more. It is considered that by setting the $\Delta$HSP to 5.0 or less, the compatibility between the high-molecular-weight compound and crosslinkable monomer in the composition is increased, and deviation (variation) in distribution of the crosslinkable monomers in the underlayer film is suppressed. Consequently, the crosslinkable monomer uniformly and efficiently forms crosslinks in the underlayer film. Moreover, it is presumed that by making it difficult for a place, which has relatively low film hardness and can be a starting point for the aggregation breakage of the underlayer film, to be generated, the film hardness of the entire underlayer film is improved. Furthermore, it is presumed that in a case where the crosslinkable monomer has a distance between crosslinking points of 7 or more, which is a sufficient length, the crosslinkable monomer can efficiently form crosslinks between macromolecules, and thus the film hardness at each spot is also improved.

As described above, it is considered that in a case where the composition for forming an underlayer film according to the embodiment of the present invention is used, an underlayer film having excellent film hardness can be obtained by a synergistic action of an action of improving the overall film hardness (macroscopic hardness) by suppressing the generation of portions having relatively low film hardness and an action of improving the film hardness (microscopic hardness) at each spot. Moreover, since the underlayer film having excellent film hardness can be formed, in a case where the mold is peeled off from the composition for forming a pattern, sufficient adhesiveness between the substrate and the composition for forming a pattern can be ensured, and thus releasability in the imprinting method is improved. As a result, a fine pattern can also be efficiently formed.

Hereinafter, each component of the composition for forming an underlayer film according to the embodiment of the present invention will be described in detail.

<<High-Molecular-Weight Compound Having Polymerizable Group>>

In the composition for forming an underlayer film according to the embodiment of the present invention, the high-molecular-weight compound having a polymerizable group is usually a component having the highest content in the solid content, the kind of the high-molecular-weight compound is not particularly limited, and well-known high-molecular-weight compounds can be widely used.

Examples of the high-molecular-weight compound include a (meth)acrylic resin, a vinyl resin, a novolac resin, an epoxy resin, a polyurethane resin, a phenol resin, a polyester resin, and a melamine resin, and at least one kind of a (meth)acrylic resin, a vinyl resin, or a novolac resin is preferable.

In the present invention, a weight-average molecular weight of the high-molecular-weight compound is preferably 2,000 or greater, more preferably 4,000 or greater, still more preferably 6,000 or greater, and particularly preferably 10,000 or greater. The upper limit thereof is preferably 70,000 or less and may be 50,000 or less. A method for measuring the molecular weight is as described above. In a case where the weight-average molecular weight is 4,000 or greater, film stability during a heating treatment is improved, which leads to the improvement in a surface condition during the formation of the underlayer film. Moreover, in a case where the weight-average molecular weight is 70,000 or less, the solubility in a solvent is improved, and thus the spin coat application and the like are easily performed.

The polymerizable group of the high-molecular-weight compound is not particularly limited, but preferably includes at least one kind selected from a group having an ethylenically unsaturated bond, a cyclic ether group, or a methylol group, more preferably includes at least one kind selected from a group having an ethylenically unsaturated bond or a cyclic ether group, and still more preferably includes a group having an ethylenically unsaturated bond. Moreover, these groups may have a substituent.

Regarding the polymerizable group of the high-molecular-weight compound, the group having an ethylenically unsaturated bond is preferably a group having a vinyl group or an ethynyl group and more preferably a group having a vinyl group. Examples of the group having a vinyl group include a vinyloxy group (—O—CH=CH$_2$), a vinylcarbonyl group (acryloyl group) (—CO—CH=CH$_2$), a vinylamino group (—NR—CH=CH$_2$), a vinyl sulfide group (—S—CH=CH$_2$), a vinylsulfonyl group (—SO$_2$—CH=CH$_2$), a vinylphenyl (Ph) group (-Ph-CH=CH$_2$), an acryloyloxy group (—O—CO—CH=CH$_2$), and an acryloylamino group (—NR—CO—CH=CH$_2$), a vinyloxy group, an acryloyl group, a vinylphenyl group, an acryloyloxy group, or an acryloylamino group is more preferable, and a vinyloxy group or an acryloyloxy group is still more preferable. In the "—NR—", R represents a hydrogen atom or a substituent. These groups may have a substituent. Examples of the polymerizable group having a substituent include a methacryloyl group and a methacryloyloxy group. The group having an ethylenically unsaturated bond is particularly preferably a (meth)acryloyloxy group.

Regarding the polymerizable group, the cyclic ether group is preferably a cyclic alkyleneoxy group having 2 to 6 carbon atoms, more preferably a cyclic alkyleneoxy group having 2 to 4 carbon atoms, still more preferably an epoxy group or an oxetane group, and particularly preferably an epoxy group. Therefore, the polymerizable group including a cyclic ether group is, for example, preferably an epoxy group or oxetane group itself, a glycidyl group, a glycidyl ether group, or the like, and more preferably an epoxy group.

In a case where a plurality of the polymerizable groups are present in the high-molecular-weight compound, these groups may be the same kind of functional groups or different kinds of functional groups.

In addition, the "substituent" in the present specification includes one kind of substituent T selected from a halogen atom, a cyano group, a nitro group, a hydrocarbon group, a heterocyclic group, —ORt$^1$, —CORt$^1$, —COORt$^1$, —OCORt$^1$, —NRt$^1$Rt$^2$, —NHCORt$^1$, —CONRt$^1$Rt$^2$, —NHCONRt$^1$Rt$^2$, —NHCOORt$^1$, —SRt$^1$, —SO$_2$Rt$^1$, —SO$_2$ORt$^1$, —NHSO$_2$Rt$^1$, or —SO$_2$NRt$^1$Rt$^2$, unless otherwise specified. Here, Rt$^1$ and Rt$^2$ each independently represent a hydrogen atom, a hydrocarbon group, or a heterocyclic group. In a case where Rt$^1$ and Rt$^2$ are hydrocarbon groups, Rt$^1$ and Rt$^2$ may be bonded to each other to form a ring.

Regarding the substituent T, examples of the halogen atom include a fluorine atom, a chlorine atom, a bromine atom, and an iodine atom. Examples of the hydrocarbon group include an alkyl group, an alkenyl group, an alkynyl group, and an aryl group. The number of carbon atoms in the alkyl group is preferably 1 to 10, more preferably 1 to 5, and still more preferably 1 or 2. The alkyl group may be linear, branched, or cyclic, and is preferably linear or branched. The number of carbon atoms in the alkenyl group is preferably 2 to 10, more preferably 2 to 5, and particularly preferably 2 or 3. The alkenyl group may be linear, branched, or cyclic, and is preferably linear or branched. The number of carbon atoms in the alkynyl group is preferably 2 to 10 and more preferably 2 to 5. The alkynyl group may be linear or branched, and is preferably linear. The number of carbon atoms in the aryl group is preferably 6 to 10, more preferably 6 to 8, and still more preferably 6 or 7. The heterocyclic group may be a single ring or a polycyclic ring. The heterocyclic group is preferably a single ring or a polycyclic ring having 2 to 4 rings. The number of heteroatoms constituting the ring of the heterocyclic group is preferably 1 to 3. The heteroatom constituting the ring of the heterocyclic group is preferably a nitrogen atom, an oxygen atom, or a sulfur atom. The number of carbon atoms constituting the ring of the heterocyclic group is preferably 3 to 10, more preferably 3 to 8, and still more preferably 3 to 5.

The hydrocarbon group and the heterocyclic group as the substituent T may further have another substituent or may be unsubstituted. Examples of the other substituent here include the aforementioned substituents T.

The high-molecular-weight compound preferably has a hydrogen bonding group (functional group having polarity) in order to cause adhesiveness to a substrate to be firm.

Specific examples of the hydrogen bonding group include a hydroxyl group, a carboxy group, an amide group, an imide group, a urea group, a urethane group, a cyano group, an ether group (preferably, a polyalkyleneoxy group), a cyclic ether group, a lactone group, a sulfonyl group, a sulfo group, a sulfonic acid group, a sulfonamide group, a sulfonimide group, a phosphoric acid group, a phosphoric acid ester group, and a nitrile group. Among them, in particular, the hydrogen bonding group is preferably a sulfonyl group, a sulfo group, a sulfonic acid group, a sulfonamide group, a sulfonimide group, a phosphoric acid group, a phosphoric acid ester group, a nitrile group, a carboxy group, an amino group, and a hydroxyl group, and more preferably a carboxy group and a hydroxyl group.

The high-molecular-weight compound preferably contains a polymer having at least one of constitutional units represented by Formulae (1) to (4).

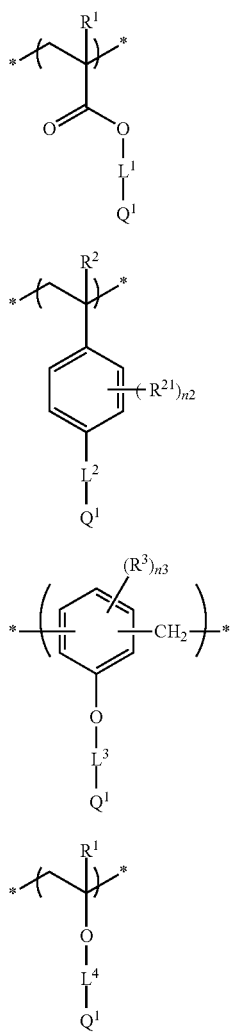

In the formulae, $R^1$, $R^2$, and $R^4$ are each independently a hydrogen atom or a methyl group. $R^{21}$ and $R^3$ are each independently the aforementioned substituent T. n2 is an integer of 0 to 4. n3 is an integer of 0 to 3.

$L^1$, $L^2$, $L^3$, and $L^4$ are each independently a single bond, or a linking group L which will be described later. Among them, $L^1$, $L^2$, $L^3$, and $L^4$ are each preferably a single bond, or one kind selected from an alkylene group, a carbonyl group, an arylene group, or an (oligo)alkyleneoxy group, which is defined as the linking group L, or a combination of two or more kinds thereof. Here, the presence or absence of an oxygen atom at a terminal of the (oligo)alkyleneoxy group may be adjusted according to a structure of a preceding group. In the present specification, the "(oligo)alkyleneoxy group" means a divalent linking group having one or more "alkyleneoxy" constitutional units. The number of carbon atoms in an alkylene chain in the constitutional unit may be the same or different for every constitutional unit.

$Q^1$ is a functional group of the high-molecular-weight compound, and as the functional group $Q^1$, the examples of the aforementioned polymerizable group can be each independently mentioned.

In a case where there are a plurality of $R^{21}$'s, $R^{21}$'s may be linked to each other to form a cyclic structure. In the present specification, the linking is meant to include not only an aspect in which groups are continued by bonding but also an aspect in which groups lose some atoms and are fused (condensed). Moreover, unless otherwise specified, in a case of the linking, an oxygen atom, a sulfur atom, and a nitrogen atom (amino group) may be interposed. Examples of the formed cyclic structure include an aliphatic hydrocarbon ring (the ring is referred to as a ring Cf) (for example, a cyclopropane ring, a cyclobutane ring, a cyclopentane ring, a cyclohexane ring, a cyclopropene ring, a cyclobutene ring, a cyclopentene ring, a cyclohexene ring, and the like), an aromatic hydrocarbon ring (the ring is referred to as a ring Cr) (a benzene ring, a naphthalene ring, an anthracene ring, a phenanthrene ring, and the like), a nitrogen-containing heterocyclic ring (the ring is referred to as a ring Cn) (for example, a pyrrole ring, an imidazole ring, a pyrazole ring, a pyridine ring, a pyrroline ring, a pyrrolidine ring, an imidazolidine ring, a pyrazolidine ring, a piperidine ring, a piperazine ring, a morpholine ring, and the like), an oxygen-containing heterocyclic ring (the ring is referred to as a ring Co) (a furan ring, a pyran ring, an oxirane ring, an oxetane ring, a tetrahydrofuran ring, a tetrahydropyran ring, a dioxane ring, and the like), and a sulfur-containing heterocyclic ring (the ring is referred to as a ring Cs) (a thiophene ring, a thiirane ring, a thietane ring, a tetrahydrothiophene ring, a tetrahydrothiopyran ring, and the like).

In a case where there are a plurality of $R^3$'s, $R^3$'s may be linked to each other to form a cyclic structure. Examples of the formed cyclic structure include the ring Cf, the ring Cr, the ring Cn, the ring Co, and the ring Cs.

In the composition for forming an underlayer film according to the embodiment of the present invention, in a case where the high-molecular-weight compound having a polymerizable group is a polymer, a proportion of the number of constitutional units having a polymerizable group with respect to the total number of constitutional units in the high-molecular-weight compound is preferably 20% to 100% by mole. The lower limit of the numerical range is preferably 30% by mole or greater and more preferably 60% by mole or greater. The upper limit of the numerical range may be 100% by mole or less or 80% by mole or less. In a case where there are a plurality of kinds of constitutional units having a polymerizable group, the total amount thereof is preferably within the above range.

Specific examples of a repeating unit containing a preferred polymerizable group include the following structures. However, the present invention is not limited thereto. In the following exemplified chemical formulae, $R^6$'s each independently represent a hydrogen atom or a methyl group.

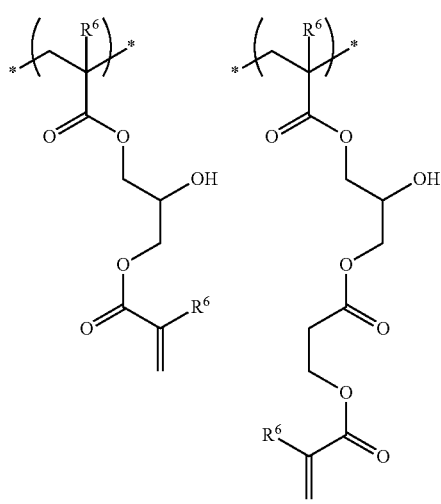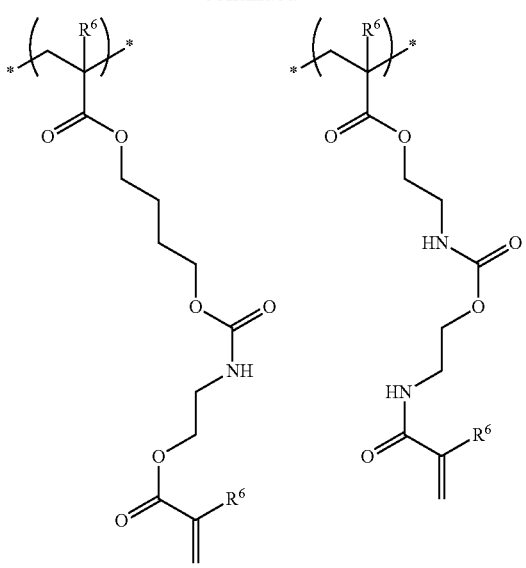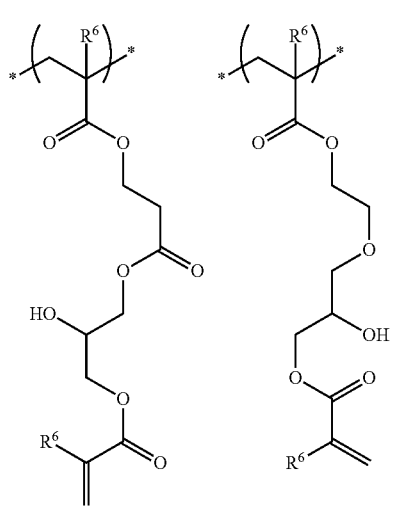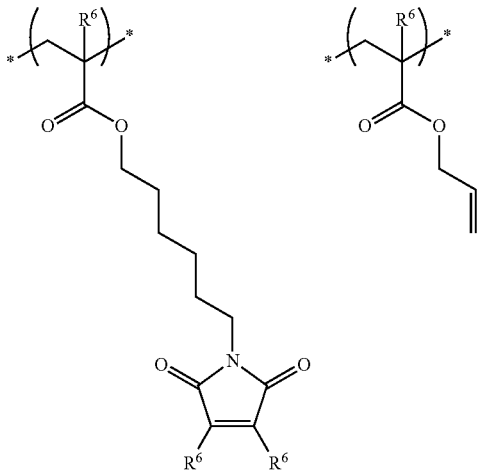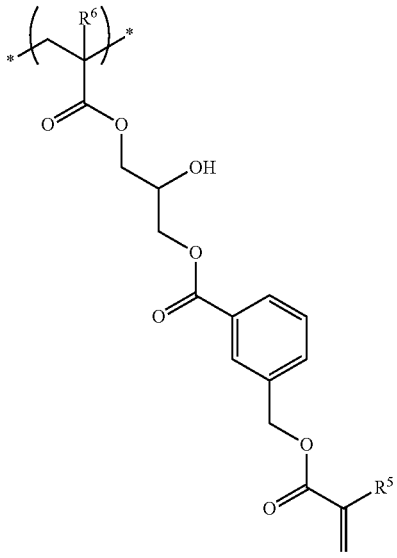

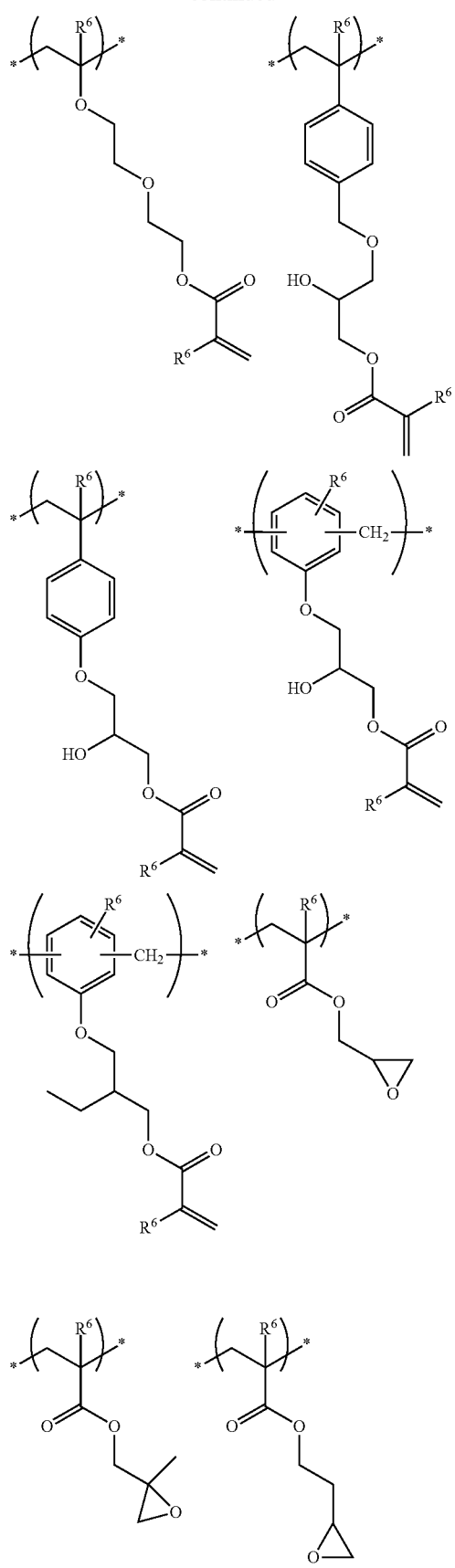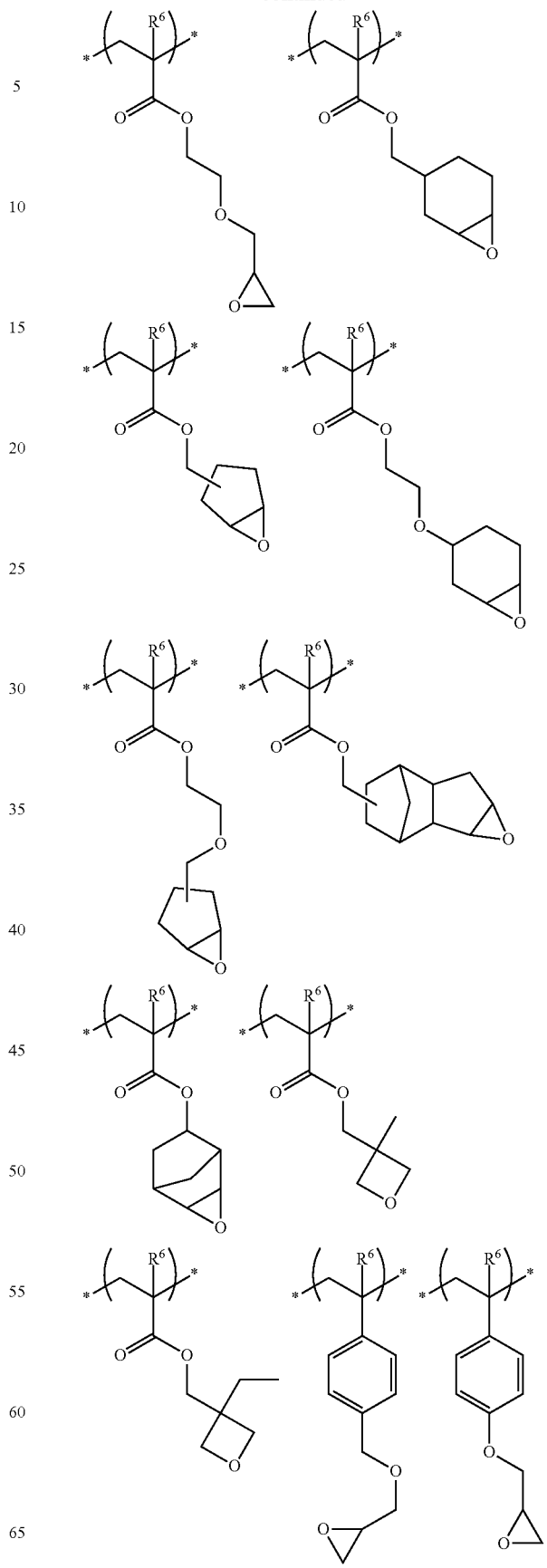

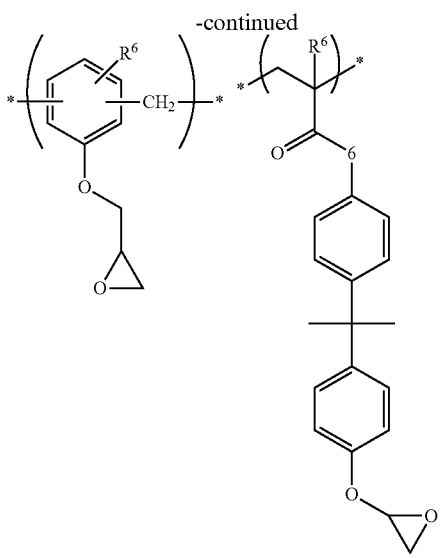

The high-molecular-weight compound may be a copolymer having a constitutional unit other than the constitutional units represented by Formulae (1) to (4). Examples of the other constitutional unit include the following (11), (21), and (31). In the high-molecular-weight compound, the constitutional unit (11) is preferably combined with the constitutional unit (1), the constitutional unit (21) is preferably combined with the constitutional unit (2), and the constitutional unit (31) is preferably combined with the constitutional unit (3).

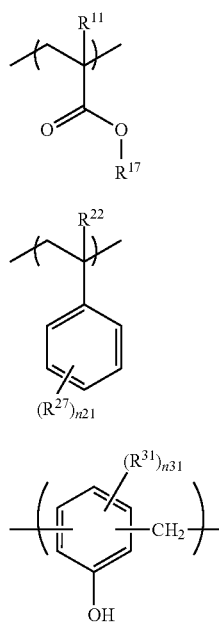

In the formulae, $R^{11}$ and $R^{22}$ are each independently a hydrogen atom or a methyl group. $R^{31}$ is the aforementioned substituent T, and n31 is an integer of 0 to 3. In a case where there are a plurality of $R^{31}$'s, $R^{31}$'s may be linked to each other to form a cyclic structure. Examples of the formed cyclic structure include examples of the ring Cf, the ring Cr, the ring Cn, the ring Co, and the ring Cs.

$R^{17}$ is an organic group, which forms an ester structure with a carbonyloxy group in the formula, or a hydrogen atom. The organic group is an alkyl group (the number of carbon atoms is preferably 1 to 24, more preferably 1 to 12, and still more preferably 1 to 6; and the alkyl group may be chain-like or cyclic, or may be linear or branched), an aryl group (the number of carbon atoms is preferably 6 to 22, more preferably 6 to 18, and still more preferably 6 to 10), an arylalkyl group (the number of carbon atoms is preferably 7 to 23, more preferably 7 to 19, and still more preferably 7 to 11; and the alkyl group moiety may be chain-like or cyclic, or may be linear or branched), a group consisting of an aromatic heterocyclic ring in which an oxygen atom in the formula is bonded to a carbon atom (in terms of cyclic structure, a pyrrole ring, an imidazole ring, a pyrazole ring, a pyridine ring, a furan ring, a thiophene ring, a thiazole ring, an oxazole ring, an indole ring, a carbazole ring, and the like), or a group consisting of an aliphatic heterocyclic ring in which an oxygen atom in the formula is bonded to a carbon atom (in terms of cyclic structure, a pyrroline ring, a pyrrolidine ring, an imidazolidine ring, a pyrazolidine ring, a piperidine ring, a piperazine ring, a morpholine ring, a pyran ring, an oxirane ring, an oxetane ring, a tetrahydrofuran ring, a tetrahydropyran ring, a dioxane ring, a thiirane ring, a thietane ring, a tetrahydrothiophene ring, and a tetrahydrothiopyran ring).

$R^{17}$ may further have the substituent T as long as the effects of the present invention are exhibited.

$R^{27}$ is the aforementioned substituent T, and n21 is an integer of 0 to 5. In a case where there are a plurality of $R^{27}$'s, $R^{27}$'s may be linked to each other to form a cyclic structure. Examples of the formed cyclic structure include examples of the ring Cf, the ring Cr, the ring Cn, the ring Co, and the ring Cs.

An alkyl moiety and an alkenyl moiety contained in each substituent may be chain-like or cyclic, or may be linear or branched. In a case where the substituent T is a group capable of taking a substituent, the substituent T may further have a substituent T. For example, a hydroxyalkyl group in which a hydroxyl group is substituted for an alkyl group may be mentioned.

Examples of the linking group L include an alkylene group (the number of carbon atoms is preferably 1 to 24, more preferably 1 to 12, and still more preferably 1 to 6), an alkenylene group (the number of carbon atoms is preferably 2 to 12, more preferably 2 to 6, and still more preferably 2 or 3), an (oligo)alkyleneoxy group (the number of carbon atoms in an alkylene group in one constitutional unit is preferably 1 to 12, more preferably 1 to 6, and still more preferably 1 to 3; and the repetition number is preferably 1 to 50, more preferably 1 to 40, and still more preferably 1 to 30), an arylene group (the number of carbon atoms is preferably 6 to 22, more preferably 6 to 18, and still more preferably 6 to 10), an oxygen atom, a sulfur atom, a sulfonyl group, a carbonyl group, a thiocarbonyl group, —$NR^N$—, and a linking group related to a combination thereof. $R^N$ is a hydrogen atom, an alkyl group of the substituent T, an alkenyl group of the substituent T, an aryl group of the substituent T, an arylalkyl group of the substituent T, or a heterocyclic group of the substituent T. The alkylene group, alkenylene group, and alkyleneoxy group may have the substituent T. For example, the alkylene group may have a hydroxyl group.

A linking chain length of the linking group L is preferably 1 to 24, more preferably 1 to 12, and still more preferably 1 to 6. The linking chain length means the number of atoms positioned on the shortest path among the atomic groups involved in the linkage. For example, in a case of —$CH_2$—$C(=O)$—$O$—, the linking chain length is 3.

Furthermore, the alkylene group, alkenylene group, and (oligo)alkyleneoxy group as the linking group L, may be chain-like or cyclic, or may be linear or branched.

It is preferable that as an atom constituting the linking group L, a carbon atom, a hydrogen atom, and as necessary, a heteroatom (at least one kind selected from an oxygen atom, a nitrogen atom, or a sulfur atom, and the like) are included. The number of carbon atoms in the linking group is preferably 1 to 24, more preferably 1 to 12, and still more preferably 1 to 6. The number of hydrogen atoms may be determined according to the number of carbon atoms and the like. For each of the oxygen atom, the nitrogen atom, and the sulfur atom, the number of heteroatoms is preferably 0 to 12, more preferably 0 to 6, and still more preferably 0 to 3.

The high-molecular-weight compound may be synthesized by a conventional method. For example, a polymer having the constitutional unit represented by Formula (1) can be appropriately synthesized according to a well-known method for addition polymerization of olefin. For example, a polymer having the constitutional unit represented by Formula (2) can be appropriately synthesized according to a well-known method for addition polymerization of styrene. For example, a polymer having the constitutional unit represented by Formula (3) can be appropriately synthesized according to a well-known method for synthesis of a phenol resin. For example, a polymer having the constitutional unit represented by Formula (4) can be appropriately synthesized according to a well-known method for synthesis of a vinyl ether resin.

A formulation amount of the high-molecular-weight compound is not particularly limited, but preferably accounts for a majority in the solid content in the composition for forming an underlayer film, and is more preferably 70% by mass or greater in the solid content and still more preferably 80% by mass or greater in the solid content. The upper limit thereof is not particularly limited, but is practically 99.0% by mass or less.

A content of the high-molecular-weight compound in the composition for forming an underlayer film (including a solvent) is not particularly limited, but is preferably 0.01% by mass or greater, more preferably 0.05% by mass or greater, and still more preferably 0.1% by mass or greater. The upper limit thereof is preferably 10% by mass or lower, more preferably 5% by mass or lower, still more preferably 1% by mass or lower, and even more preferably lower than 1% by mass.

The polymer may be used alone or in combination of a plurality thereof. In a case where the plurality thereof is used, the total amount thereof is within the above range.

<<Crosslinkable Monomer>>

The composition for forming an underlayer film according to the embodiment of the present invention contains a crosslinkable monomer having a plurality of crosslinkable groups. It is presumed that doing so causes the formation of a crosslink between macromolecules and thus the film hardness of the underlayer film is improved. The number of crosslinkable groups in one molecule of the crosslinkable monomer is preferably 6 or less and more preferably 5 or less, and may be 4 or 3.

A molecular weight of the crosslinkable monomer in the present invention is preferably less than 2,000, more preferably 1,500 or less, and still more preferably 1,000 or less, and may be 800 or less. The lower limit value thereof is preferably 100 or greater.

The plurality of the crosslinkable groups of the crosslinkable monomer are not particularly limited as long as the crosslinkable groups are functional groups capable of being bonded to the polymerizable group of the high-molecular-weight compound, but the plurality of crosslinkable groups each independently preferably include at least one kind selected from a group having an ethylenically unsaturated bond, a cyclic ether group, a carboxy group, an amino group, an isocyanate group, or a phenolic hydroxyl group, more preferably include at least one kind selected from a group having an ethylenically unsaturated bond or a cyclic ether group, and still more preferably include a group having an ethylenically unsaturated bond. Moreover, these groups may have a substituent. The plurality of crosslinkable groups may be the same kind of functional groups or different kinds of functional groups.

Regarding the plurality of crosslinkable groups of the crosslinkable monomer, the group having an ethylenically unsaturated bond is preferably a group having a vinyl group or an ethynyl group and more preferably a group having a vinyl group. Examples of the group having a vinyl group include the same functional groups as those described for the polymerizable group of the high-molecular-weight compound, and among them, a vinyloxy group, an acryloyl group, a vinylphenyl group, an acryloyloxy group, or an acryloylamino group is more preferable, and a vinyloxy group or an acryloyloxy group is still more preferable. These groups may have a substituent. Examples of the crosslinkable group having a substituent include a methacryloyl group and a methacryloyloxy group. The group having an ethylenically unsaturated bond is particularly preferably a (meth)acryloyloxy group.

Regarding the crosslinkable group, examples of the cyclic ether group include the same functional groups as those described for the polymerizable group of the high-molecular-weight compound, and among them, an epoxy group or an oxetane group is preferable, and an epoxy group is more preferable. Therefore, the crosslinkable group including a cyclic ether group is, for example, preferably an epoxy group or oxetane group itself, a glycidyl group, a glycidyl ether group, or the like, and more preferably an epoxy group.

Furthermore, as the plurality of crosslinkable groups of the crosslinkable monomer, functional groups capable of being bonded to the polymerizable group of the high-molecular-weight compound are appropriately adopted from among the aforementioned crosslinkable groups. In particular, at least one kind of the polymerizable group or the crosslinkable group preferably includes a group having an ethylenically unsaturated bond, more preferably includes a (meth)acryloyl group, and still more preferably includes a (meth)acryloyloxy group. In particular, both the polymerizable group and the crosslinkable group preferably include a group having an ethylenically unsaturated bond, more preferably include a (meth)acryloyl group, and still more preferably include a (meth)acryloyloxy group.

Preferred combinations of the polymerizable group and the crosslinkable group are, for example, as follows. In a case where there are a plurality of polymerizable groups and a plurality of crosslinkable groups in one molecule, the aspects of the polymerizable groups and the crosslinkable groups may correspond to a plurality of the following combinations.

Combination in which both the polymerizable group and the crosslinkable group are (meth)acryloyl groups.

Combination in which one of them is a (meth)acryloyl group and the other is a (meth)acryloyloxy group.

Combination in which both of them are (meth)acryloyloxy groups.

Combination in which one of them includes a (meth)acryloyl group and the other includes an epoxy group.

Combination in which both of them include epoxy groups.

Combination in which one of them includes an epoxy group and the other includes a carboxy group, an amino group, an isocyanate group, or a phenolic hydroxyl group.

In addition, in the present invention, it is also preferable that the crosslinkable monomer has a crosslinkable group that is also capable of being bonded to a polymerizable compound in a composition for forming a pattern, which will be described later. Consequently, at an interface between the underlayer film and the composition for forming a pattern applied onto the underlayer film, the crosslinkable monomer may crosslink the high-molecular-weight compound in the underlayer film and the polymerizable compound in the composition for forming a pattern, and thus the adhesiveness between the underlayer film and the composition for forming a pattern is further improved.

A method for bonding the polymerizable group to the crosslinkable group is not particularly limited, a well-known method can be appropriately adopted depending on the kinds of the polymerizable group and the crosslinkable group, and it is preferable to impart at least one of light energy or thermal energy. A timing at which the polymerizable group is bonded to the crosslinkable group is not particularly limited as long as the timing is between the application of the composition for forming an underlayer film onto the substrate and the peeling-off of the mold from the composition for forming a pattern. As an example of an aspect in which the polymerizable group is bonded to the crosslinkable group, there is a method (first method) in which a composition for forming an underlayer film is applied onto a substrate, and then the composition for forming an underlayer film is subjected to light irradiation, heating, and the like before a composition for forming a pattern is applied onto the composition for forming an underlayer film, to thereby promote a bonding reaction between the polymerizable group and the crosslinkable group. Moreover, as another aspect, there is also a method (second method) in which a composition for forming an underlayer film is applied onto a substrate, the composition for forming an underlayer film is dried, as necessary, then a composition for forming a pattern is applied onto the composition for forming an underlayer film, a mold is pressed against the composition for forming a pattern, and subsequently, in a case where the composition for forming a pattern is cured, light irradiation, heating, and the like are performed together, to thereby promote a bonding reaction between the polymerizable group and the crosslinkable group. The first aspect is preferable as the aspect in which the polymerizable group is bonded to the crosslinkable group.

Regarding the crosslinkable monomer contained in the composition for forming an underlayer film according to the embodiment of the present invention, the Hansen solubility parameter distance, which is a difference between the Hansen solubility parameter of the high-molecular-weight compound and the Hansen solubility parameter of the crosslinkable monomer, is 5.0 or less. The Hansen solubility parameter distance ($\Delta HSP$) is derived by Expression (1).

$$\Delta HSP = [4.0 \times (\Delta D^2 + \Delta P^2 + \Delta H^2)]0.5 \qquad \text{Expression (1)}$$

In Expression (1), $\Delta D$, $\Delta P$, and $\Delta H$ are each as follows.

$\Delta D$: a difference (d component 1–d component 2) between a dispersion element component (d component 1) of a Hansen solubility parameter vector of a monomer unit constituting the high-molecular-weight compound in the composition for forming an underlayer film and a dispersion element component (d component 2) of a Hansen solubility parameter vector of the crosslinkable monomer contained in the composition for forming an underlayer film.

$\Delta P$: a difference (p component 1–p component 2) between a polarity element component (p component 1) of the Hansen solubility parameter vector of the monomer unit constituting the high-molecular-weight compound in the composition for forming an underlayer film and a polarity element component (p component 2) of the Hansen solubility parameter vector of the crosslinkable monomer contained in the composition for forming an underlayer film.

$\Delta H$: a difference (h component 1–h component 2) between a hydrogen bond element component (h component 1) of the Hansen solubility parameter vector of the monomer unit constituting the high-molecular-weight compound in the composition for forming an underlayer film and a hydrogen bond element component (h component 2) of the Hansen solubility parameter vector of the crosslinkable monomer contained in the composition for forming an underlayer film.

Here, in a case where the high-molecular-weight compound in the composition for forming an underlayer film is a copolymer constituted of a plurality of kinds of monomer units, a value obtained by weighted-averaging HSP component values calculated for each monomer unit with a weight ratio and a molar ratio is adopted as each component value of the high-molecular-weight compound. For example, in a case of a high-molecular-weight compound (a+b+c=1) constituted of a monomer unit in which the component value of the d component of the HSP is da, the formula weight is A, and the molar ratio (presence ratio of the monomer unit) in the high-molecular-weight compound is a, a monomer unit in which the component value is db, the formula weight is B, and the molar ratio is b, and a monomer unit in which the component value is dc, the formula weight is C, and the molar ratio is c, the d component 1 of the high-molecular-weight compound is calculated based on Expression (2). The same also applies to the p component 1 and the h component 1.

$$d \text{ component } 1 = \frac{da \cdot A \cdot a + db \cdot B \cdot b + dc \cdot C \cdot c}{A \cdot a + B \cdot b + C \cdot c} \qquad \text{Expression (2)}$$

In the present invention, it is considered that by setting the $\Delta HSP$ to 5.0 or less, the compatibility between the macromolecule and the crosslinkable monomer is increased, and deviation (variation) in distribution of the crosslinkable monomers in the underlayer film is suppressed. The $\Delta HSP$ is preferably 4 or less and more preferably 3 or less. The lower limit of the ΔHSP is not particularly limited, but is practically 0.5 or greater and may be 1.0 or greater.

In the present invention, it is preferable that at least one kind of the high-molecular-weight compound or the crosslinkable monomer has a ring structure, and more preferable that both of them have a ring structure. Consequently, the compatibility between the high-molecular-weight compound and the crosslinkable monomer is further improved. The ring structure may be any one of an aliphatic ring, an aromatic ring, or a heterocyclic ring (having aromaticity and non-aromaticity), and is preferably an aromatic ring. The ring structure may be a single ring or a polycyclic ring. In a case where the ring structure is a polycyclic ring, the number of rings is preferably 10 or less, more preferably 5 or less, and still more preferably 4 or less, and may be 3 or 2.

The aliphatic ring as the ring structure is preferably cycloalkane or cycloalkene having 4 to 20 carbon atoms. Here, the number of carbon atoms is more preferably 5 to 10 and still more preferably 5 to 7. Examples of the aliphatic ring include cyclopentane and cyclohexane. In a case where the ring structure is an aromatic ring, the number of carbon atoms is preferably 6 to 20, more preferably 6 to 10, and still more preferably 6. Examples of the aromatic ring include benzene and naphthalene. Meanwhile, the heterocyclic ring preferably contains a nitrogen atom, more preferably has a skeleton such as a pyridine ring, a pyrazine ring, a pyrimidine ring, and a triazine ring, and still more preferably has a triazine ring.

In the crosslinkable monomer contained in the composition for forming an underlayer film according to the embodiment of the present invention, the distance between crosslinking points is 7 or more. It is considered that in a case where the distance between crosslinking points is sufficiently long as described above, the crosslinkable monomer can efficiently form crosslinks between macromolecules, and thus the film hardness at each spot is also improved. The upper limit of the distance between crosslinking points preferably 20 or less, more preferably 17 or less, and still more preferably 15 or less. The lower limit of the distance between crosslinking points is preferably 8 or more and more preferably 9 or more.

Here, a method for deriving the distance between crosslinking points will be described. The distance between crosslinking points is derived by identifying a crosslinking point from each of two crosslinkable groups of one crosslinkable monomer, and counting the number of atoms in the shortest atom chain linking the two crosslinking points. Here, the "crosslinking point" means an atomic group, in a crosslinkable group, of which the bonding state is changed before and after a crosslinking reaction in which the crosslinkable group is bonded to the polymerizable group. The "change in the bonding state" includes a case where an unsaturated bond is changed to a saturated bond, a case where ring-opening is performed, a case where the number of atoms in a bonding partner is increased or decreased, a case where the atomic species of a bonding partner is changed, a case where some atoms are converted into small molecules (for example, water) and removed, and the like. For example, as shown in Formula (L-1), in a case where the crosslinkable monomer can be understood to have an acryloyloxy group, a moiety corresponding to a vinyl group of which the bonding state is changed before and after the crosslinking reaction is recognized as a crosslinking point. Moreover, the number of constituent atoms in the shortest atom chain (in the formula, a thick line part from a position X to a position Y) between two target crosslinking points A and B, as shown in the same formula, is counted. In a case of Formula (L-1), the distance between crosslinking points is 11.

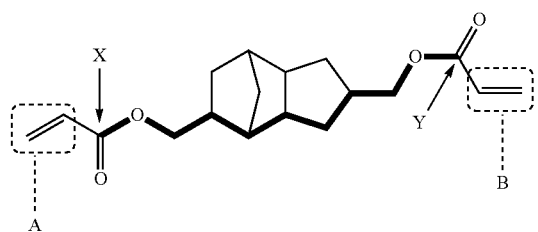

Formula (L-1)

Formula (L-2) shows relationships between representative crosslinkable groups and crosslinking points. An atomic group surrounded by a dotted line in each of the chemical formulae is a crosslinking point. Moreover, R in the amino group is a hydrogen atom or a substituent.

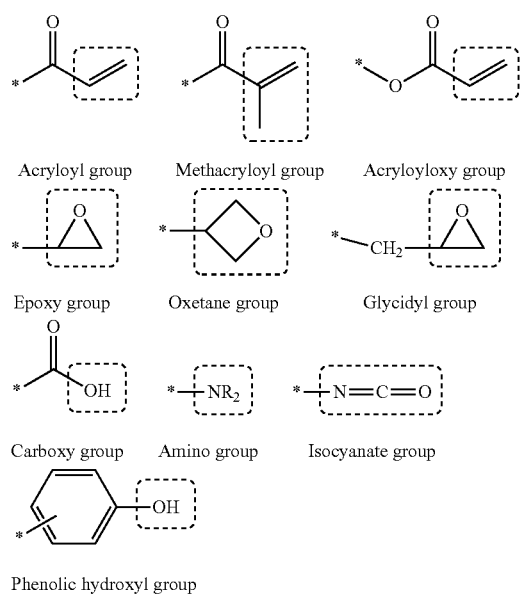

Formula (L-2)

In a case where the crosslinkable monomer has three or more crosslinkable groups, distances between crosslinking points of combinations of any two crosslinkable groups are derived, and the distance between crosslinking points of at least one combination may be 7 or more, and is preferably 8 or more and more preferably 9 or more. Moreover, in a case where the crosslinkable monomer has three or more crosslinkable groups, the distance between crosslinking points of a combination of any crosslinkable groups is preferably 20 or less, more preferably 17 or less, and still more preferably 15 or less. In a case where the crosslinkable monomer satisfies the aforementioned requirements, the film hardness of the underlayer film is further improved.

The composition for forming an underlayer film according to the embodiment of the present invention preferably contains a compound represented by Formula (2) as the crosslinkable monomer. By using such a crosslinkable monomer, adhesiveness, releasability, and temporal stability in the imprinting are well-balanced, and thus the composition for forming an underlayer film tends to be comprehensively superior.

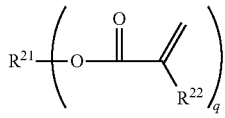

(2)

In the formula, $R^{21}$ is a q-valent organic group, $R^{22}$ is a hydrogen atom or a methyl group, and q is an integer of 2 or greater. q is preferably an integer of 2 to 7, more preferably an integer of 2 to 4, still more preferably 2 or 3, and even more preferably 2.

$R^{21}$ is preferably a divalent to heptavalent organic group, more preferably a divalent to tetravalent organic group, still more preferably a divalent or trivalent organic group, and even more preferably a divalent organic group. $R^{21}$ is preferably a hydrocarbon group having at least one of a linear structure, a branched structure, or a cyclic structure. The number of carbon atoms in the hydrocarbon group is preferably 2 to 20 and more preferably 2 to 10.

In a case where $R^{21}$ is a divalent organic group, $R^{21}$ is preferably an organic group represented by Formula (1-2).

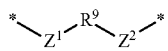

(1-2)

In the formula, it is preferable that $Z^1$ and $Z^2$ are each independently a single bond, —O—, -Alk-, or -Alk-O—. Alk represents an alkylene group (the number of carbon atoms is preferably 1 to 12, more preferably 1 to 6, and still more preferably 1 to 3), and may have a substituent as long as the effects of the present invention are not impaired. Examples of the substituent include the aforementioned substituents T. In the present specification, the asterisk in the chemical formula indicates a bonding site.

$R^9$ is a single bond or a divalent linking group. The linking group is preferably a linking group selected from Formulae (9-1) to (9-10), or a combination thereof. Among them, a linking group selected from Formulae (9-1) to (9-3), (9-7), and (9-8) is preferable.

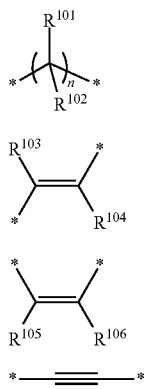

9-1

9-2

9-3

9-4

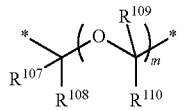

9-5

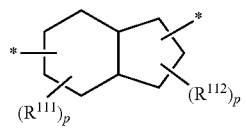

9-6

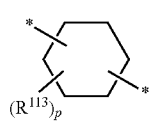

9-7

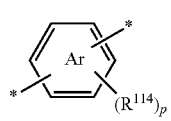

9-8

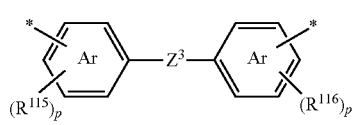

9-9

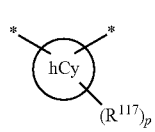

9-10

$R^{101}$ to $R^{117}$ are optional substituents. Among them, an alkyl group (the number of carbon atoms is preferably 1 to 12, more preferably 1 to 6, and still more preferably 1 to 3), an arylalkyl group (the number of carbon atoms is preferably 7 to 21, more preferably 7 to 15, and still more preferably 7 to 11), an aryl group (the number of carbon atoms is preferably 6 to 22, more preferably 6 to 18, and still more preferably 6 to 10), a thienyl group, a furyl group, a (meth)acryloyl group, a (meth)acryloyloxy group, and a (meth)acryloyloxyalkyl group (the number of carbon atoms in the alkyl group is preferably 1 to 24, more preferably 1 to 12, and still more preferably 1 to 6) are preferable. $R^{101}$ and $R^{102}$, $R^{103}$ and $R^{104}$, $R^{105}$ and $R^{106}$, $R^{107}$ and $R^{108}$, $R^{109}$ and $R^{110}$, a plurality of $R^{111}$'s, a plurality of $R^{112}$'s, a plurality of $R^{113}$'s, a plurality of $R^{114}$'s, a plurality of $R^{115}$'s, a plurality of $R^{116}$'s, and a plurality of $R^{117}$'s may be respectively bonded to each other to form a ring.

Ar is an arylene group (the number of carbon atoms is preferably 6 to 22, more preferably 6 to 18, and still more preferably 6 to 10), and specific examples thereof include a phenylene group, a naphthalenediyl group, an anthracenediyl group, a phenanthrenediyl group, and a fluorenediyl group.

hCy is a heterocyclic group (the number of carbon atoms is preferably 1 to 12, more preferably 1 to 6, and still more preferably 2 to 5), and is more preferably a 5-membered ring or a 6-membered ring. Specific examples of a hetero ring constituting hCy include a thiophene ring, a furan ring, a dibenzofuran ring, a carbazole ring, an indole ring, a tetrahydropyran ring, a tetrahydrofuran ring, a pyrrole ring, a pyridine ring, a triazine ring, a pyrazole ring, an imidazole ring, a benzimidazole ring, a triazole ring, a thiazole ring, an oxazole ring, a pyrrolidone ring, and a morpholine ring, and among them, a thiophene ring, a furan ring, and a dibenzofuran ring are preferable.

$Z^3$ is a single bond or a linking group. Examples of the linking group include alkylene groups (the number of carbon atoms is preferably 1 to 12, more preferably 1 to 6, and still more preferably 1 to 3) in which an oxygen atom, a sulfur atom, and a fluorine atom may be substituted.

n and m are each a natural number of 100 or less, and are each preferably 1 to 12, more preferably 1 to 6, and still more preferably 1 to 3.

p is 0 or greater and is an integer equal to or less than the maximum number of groups which can be substituted for each ring. In the respective cases, the upper limit values are independently preferably equal to or less than half of the maximum number of the substitutable group, more preferably 4 or less, and still more preferably 2 or less.

The crosslinkable monomer is preferably represented by Formula (2-1).

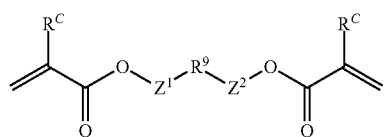

(2-1)

In Formula (2-1), $R^c$ is a hydrogen atom or a methyl group. Moreover, $R^9$, $Z^1$, and $Z^2$ have the same definitions as $R^9$, $Z^1$, and $Z^2$ in Formula (1-2), respectively, and preferred ranges thereof are also the same.

A kind of an atom constituting the crosslinkable monomer used in the present invention is not particularly specified, but the crosslinkable monomer is preferably constituted of only atoms selected from a carbon atom, an oxygen atom, a hydrogen atom, and a halogen atom, and more preferably constituted of only atoms selected from a carbon atom, an oxygen atom, and a hydrogen atom.

Examples of the crosslinkable monomer preferably used in the present invention include the following compounds. Moreover, the examples include the polymerizable compound described in JP2014-170949A, the contents of which are incorporated in the present specification.

Compound B-1

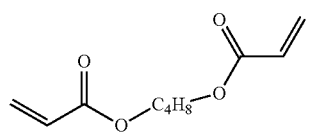

Compound B-2

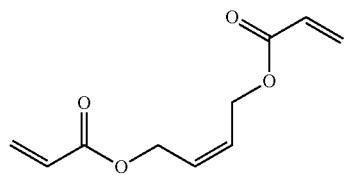

Compound B-3

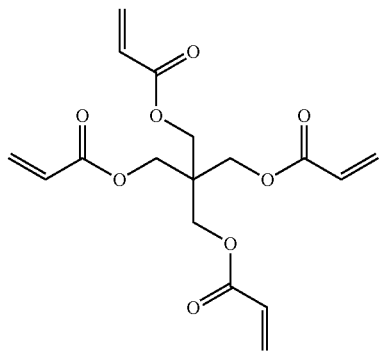

Compound B-4

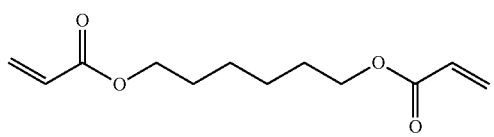

Compound B-5

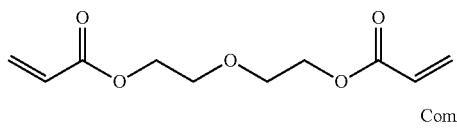

Compound B-6

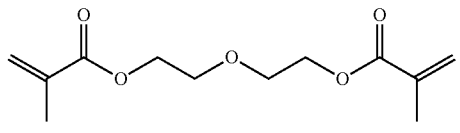

Compound B-7

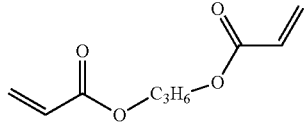

Compound B-8

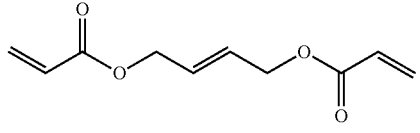

Compound B-9

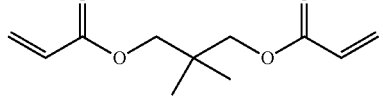

Compound B-10

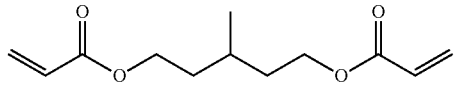

Compound B-11

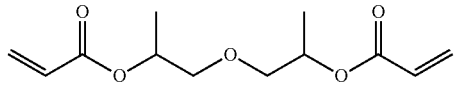

-continued
Compound B-12
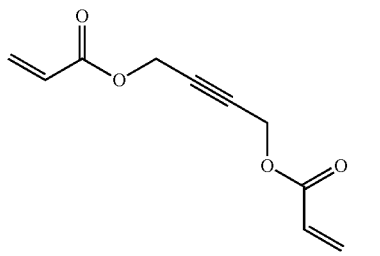
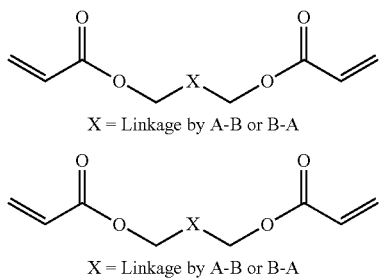
X = Linkage by A-B or B-A
Compound B-13
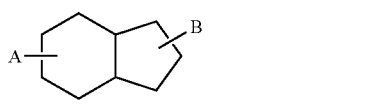
Compound B-14
Compound B-15
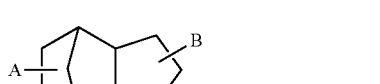
Compound B-16
Compound B-17
Compound B-18
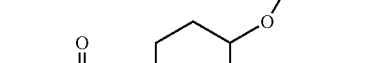
-continued
Compound B-19
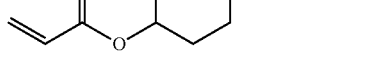
Compound B-20
Compound B-21
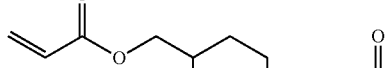
Compound B-22
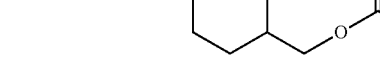
Compound B-23
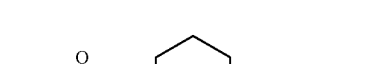
Compound B-24
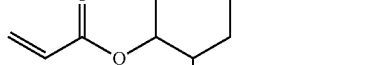
Compound B-25
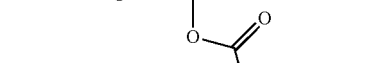

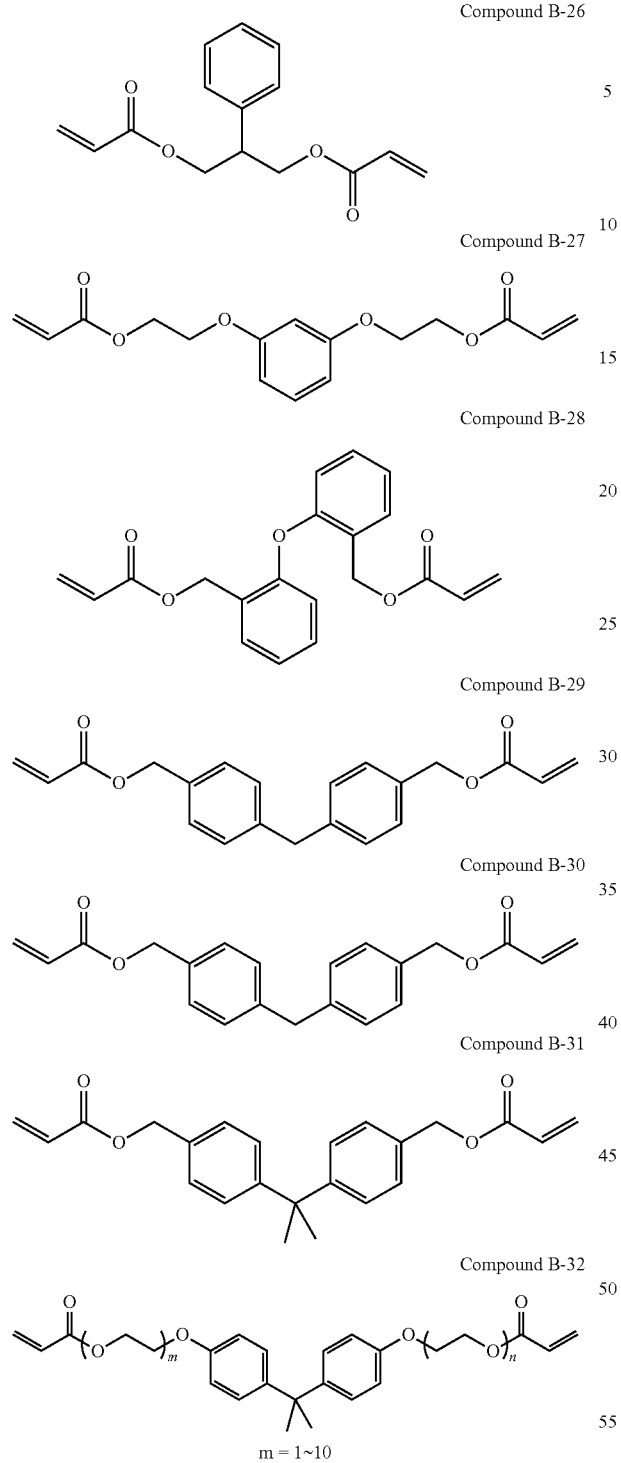
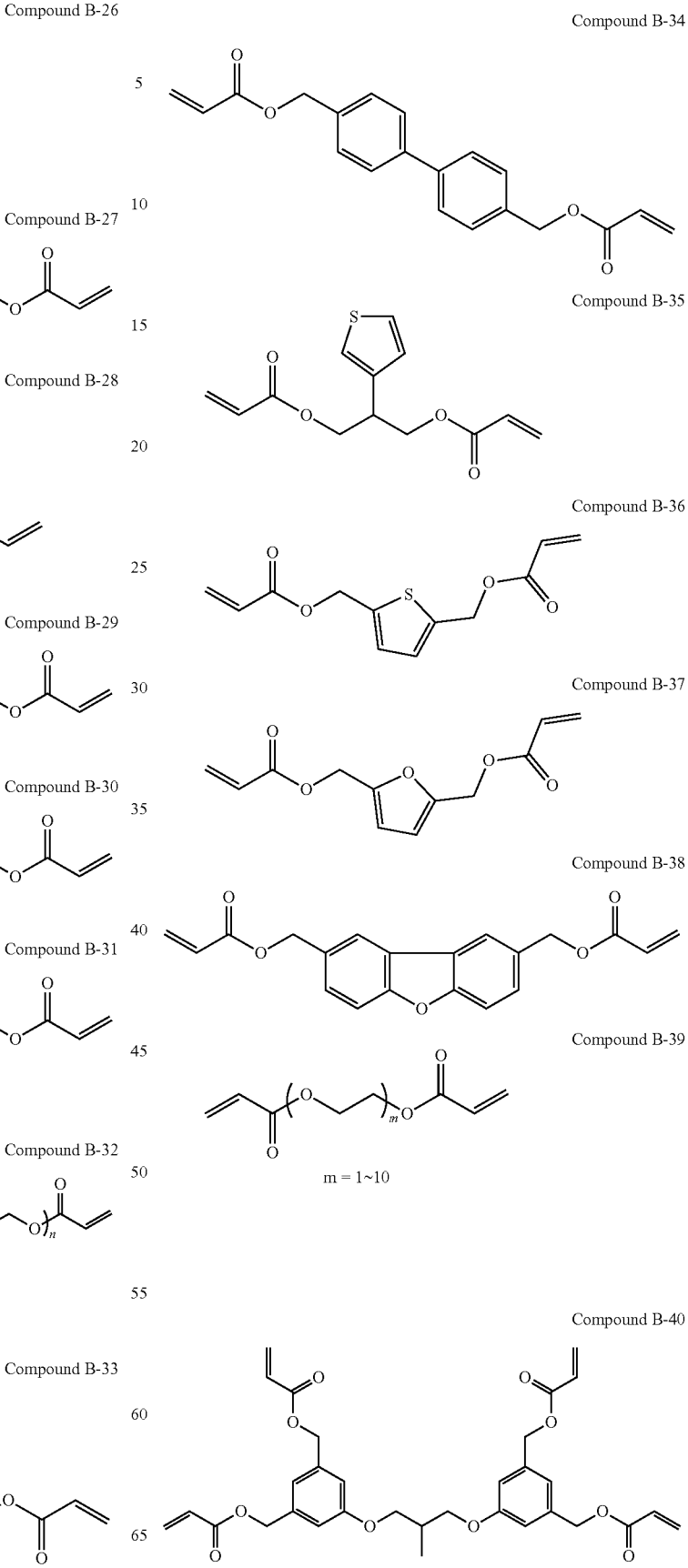

-continued

Compound B-41

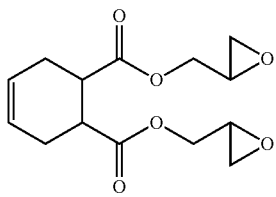

In the present invention, the content of the crosslinkable monomer in the composition for forming an underlayer film (including a solvent) is not particularly limited, but is preferably 0.01% by mass or greater, more preferably 0.05% by mass or greater, and still more preferably 0.1% by mass or greater. Moreover, the content is preferably 10% by mass or lower, more preferably 5% by mass or lower, still more preferably 1% by mass or lower, and even more preferably less than 1% by mass. In the composition for forming an underlayer film according to the embodiment of the present invention, a ratio of the crosslinkable monomer to the high-molecular-weight compound is preferably 0.1 to 1.5, in terms of mass ratio. The upper limit of the numerical range is preferably 1.2 or less, more preferably 0.9 or less, and still more preferably 0.7 or less. Moreover, the lower limit of the numerical range is preferably 0.2 or greater and more preferably 0.3 or greater. The composition for forming an underlayer film may contain only one kind or two or more kinds of the crosslinkable monomers. In a case where two or more kinds thereof are contained, the total amount thereof is preferably within the above range.

<<Solvent>>

The composition for forming an underlayer film contains a solvent (hereinafter, referred to as a "solvent for an underlayer film" in some cases). The solvent is, for example, preferably a compound which is a liquid at 23° C. and has a boiling point of 250° C. or lower. In general, the solid content other than the solvent finally forms an underlayer film. A content of the solvent for an underlayer film in the composition for forming an underlayer film is preferably 99.0% by mass or greater and more preferably 99.5% by mass or greater, and may be 99.6% by mass or greater. By setting the proportion of the solvent within the above range, a film thickness during film formation is kept thin, which leads to the improvement in pattern formability during etching processing.

Only one kind or two or more kinds of the solvents may be contained in the composition for forming an underlayer film. In a case where two or more kinds thereof are contained, the total amount thereof is preferably within the above range.

A boiling point of the solvent for an underlayer film is preferably 230° C. or lower, more preferably 200° C. or lower, still more preferably 180° C. or lower, even more preferably 160° C. or lower, and further still more preferably 130° C. or lower. The lower limit value thereof is practically 23° C. but more practically 60° C. or higher. By setting the boiling point within the above range, the solvent can be easily removed from the underlayer film, which is preferable.

The solvent for an underlayer film is preferably an organic solvent. The solvent is preferably a solvent having any one or more of an alkylcarbonyl group, a carbonyl group, a hydroxyl group, or an ether group. Among them, it is preferable to use an aprotic polar solvent.

As specific examples thereof, alkoxy alcohol, propylene glycol monoalkyl ether carboxylate, propylene glycol monoalkyl ether, lactic acid ester, acetic acid ester, alkoxypropionic acid ester, chain-like ketone, cyclic ketone, lactone, and alkylene carbonate are selected.

Examples of the alkoxy alcohol include methoxyethanol, ethoxyethanol, methoxypropanol (for example, 1-methoxy-2-propanol), ethoxypropanol (for example, 1-ethoxy-2-propanol), propoxypropanol (for example, 1-propoxy-2-propanol), methoxybutanol (for example, 1-methoxy-2-butanol and 1-methoxy-3-butanol), ethoxybutanol (for example, 1-ethoxy-2-butanol and 1-ethoxy-3-butanol), and methylpentanol (for example, 4-methyl-2-pentanol).

As the propylene glycol monoalkyl ether carboxylate, at least one selected from the group consisting of propylene glycol monomethyl ether acetate, propylene glycol monomethyl ether propionate, and propylene glycol monoethyl ether acetate is preferable, and propylene glycol monomethyl ether acetate (PGMEA) is particularly preferable.

In addition, as the propylene glycol monoalkyl ether, propylene glycol monomethyl ether (PGME) or propylene glycol monoethyl ether is preferable.

As the lactic acid ester, ethyl lactate, butyl lactate, or propyl lactate is preferable.

As the acetic acid ester, methyl acetate, ethyl acetate, butyl acetate, isobutyl acetate, propyl acetate, isoamyl acetate, methyl formate, ethyl formate, butyl formate, propyl formate, or 3-methoxybutyl acetate is preferable.

As the alkoxypropionic acid ester, methyl 3-methoxypropionate (MMP) or ethyl 3-ethoxypropionate (EEP) is preferable.

As the chain-like ketone, 1-octanone, 2-octanone, 1-nonanone, 2-nonanone, acetone, 4-heptanone, 1-hexanone, 2-hexanone, diisobutyl ketone, phenylacetone, methyl ethyl ketone, methyl isobutyl ketone, acetylacetone, acetonylacetone, ionone, diacetonyl alcohol, acetylcarbinol, acetophenone, methyl naphthyl ketone, or methyl amyl ketone is preferable.

As the cyclic ketone, methylcyclohexanone, isophorone, or cyclohexanone is preferable.

As the lactone, γ-butyrolactone (γBL) is preferable.

As the alkylene carbonate, propylene carbonate is preferable.

In addition to the aforementioned components, an ester-based solvent having 7 or more (preferably 7 to 14, more preferably 7 to 12, and still more preferably 7 to 10) carbon atoms and having 2 or less heteroatoms is preferably used.

Preferred examples of the ester-based solvent having 7 or more carbon atoms and 2 or less heteroatoms include amyl acetate, 2-methylbutyl acetate, 1-methylbutyl acetate, hexyl acetate, pentyl propionate, hexyl propionate, butyl propionate, isobutyl isobutyrate, heptyl propionate, and butyl butanoate, and isoamyl acetate is particularly preferably used.

Examples of a preferred solvent among the solvents for an underlayer film include alkoxy alcohol, propylene glycol monoalkyl ether carboxylate, propylene glycol monoalkyl ether, lactic acid ester, acetic acid ester, alkoxypropionic acid ester, chain-like ketone, cyclic ketone, lactone, and alkylene carbonate.

<<Other Components>>

The composition for forming an underlayer film may contain one or more kinds of an alkylene glycol compound, a polymerization initiator, a polymerization inhibitor, an antioxidant, a leveling agent, a thickener, a surfactant, or the like, in addition to the aforementioned components.

<<<Alkylene Glycol Compound>>>

The composition for forming an underlayer film may contain an alkylene glycol compound. The number of alkylene glycol constitutional units contained in the alkylene glycol compound is preferably 3 to 1,000, more preferably 4 to 500, still more preferably 5 to 100, and even more preferably 5 to 50. A weight-average molecular weight (Mw) of the alkylene glycol compound is preferably 150 to 10,000, more preferably 200 to 5,000, still more preferably 300 to 3,000, and even more preferably 300 to 1,000.

Examples of the alkylene glycol compound include polyethylene glycol, polypropylene glycol, mono- or di-methyl ether thereof, mono- or di-octyl ether, mono- or di-nonyl ether, mono- or di-decyl ether, monostearic acid ester, monooleic acid ester, monoadipic acid ester, and monosuccinic acid ester, and polyethylene glycol and polypropylene glycol are preferable.

Surface tension of the alkylene glycol compound at 23° C. is preferably 38.0 mN/m or higher and more preferably 40.0 mN/m or higher. The upper limit of the surface tension is not particularly specified, but is, for example, 48.0 mN/m or lower. By formulating such a compound, the wettability of the composition for forming a pattern provided immediately above the underlayer film can be further improved.

The surface tension is measured at 23° C. using a surface tensiometer SURFACE TENS-IOMETER CBVP-A3 manufactured by Kyowa Interface Science Co., LTD. and a glass plate. The unit is mN/m. Two samples are produced for one level and are respectively measured three times. An arithmetic mean value of a total of six times is adopted as an evaluation value.

A content of the alkylene glycol compound is 40% by mass or less, preferably 30% by mass or less, more preferably 20% by mass or less, and still more preferably 1% to 15% by mass, with respect to an amount of a total solid content. The alkylene glycol compound may be used alone or in combination of two or more kinds thereof. In a case where two or more kinds thereof are used, the total amount thereof is preferably within the above range.

<<<Polymerization Initiator>>>

The composition for forming an underlayer film may contain a polymerization initiator and preferably contains at least one kind of a thermal polymerization initiator or a photopolymerization initiator. By containing the polymerization initiator, a reaction of a polymerizable group contained in the composition for forming an underlayer film is promoted, and thus the adhesiveness tends to be improved. From the viewpoint that crosslinking reactivity with the composition for forming a pattern is improved, a photopolymerization initiator is preferable. As the photopolymerization initiator, a radical polymerization initiator and a cationic polymerization initiator are preferable, and a radical polymerization initiator is more preferable. Moreover, in the present invention, a plurality of kinds of photopolymerization initiators may be used in combination.

As the thermal polymerization initiator, the respective components described in JP2013-036027A, JP2014-090133A, and JP2013-189537A can be used. Also regarding the content or the like, reference can be made to the description in the aforementioned publications.

As a radical polymerization initiator, well-known compounds can be optionally used. Examples thereof include a halogenated hydrocarbon derivative (for example, a compound having a triazine skeleton, a compound having an oxadiazole skeleton, a compound having a trihalomethyl group, and the like), an acylphosphine compound such as acylphosphine oxide, hexaarylbiimidazole, an oxime compound such as an oxime derivative, an organic peroxide, a thio compound, a ketone compound, an aromatic onium salt, ketoxime ether, an aminoacetophenone compound, hydroxyacetophenone, an azo-based compound, an azide compound, a metallocene compound, an organic boron compound, and an iron arene complex. For the details thereof, reference can be made to the description in paragraphs 0165 to 0182 of JP2016-027357A, the contents of which are incorporated in the present specification.

Examples of the acylphosphine compound include 2,4,6-trimethylbenzoyl-diphenyl-phosphine oxide. Moreover, IRGACURE-819, IRGACURE 1173, and IRGACURE-TPO (trade names: all are produced by BASF SE), which are commercially available products, can be used.

In a case where the photopolymerization initiator used in the composition for forming an underlayer film is formulated, a content thereof in the total solid content is, for example, 0.0001% to 5% by mass, preferably 0.0005% to 3% by mass, and more preferably 0.01% to 1% by mass. In a case where two or more kinds of photopolymerization initiators are used, the total amount thereof is within the above range.

<Method for Producing Composition for Forming Underlayer Film>

The composition for forming an underlayer film according to the embodiment of the present invention is prepared by formulating raw materials in a predetermined ratio. The raw materials refer to components which are actively formulated in the composition for forming an underlayer film, and in which unintentionally contained components such as impurities are excluded. Specifically, a curable component and a solvent are exemplified. Here, the raw materials may be commercially available products or synthetic products. All the raw materials may contain impurities such as metal particles.

As one preferred embodiment of a method for producing the composition for forming an underlayer film according to the embodiment of the present invention, a producing method including subjecting at least one kind of raw materials contained in the composition for forming an underlayer film to a filtration treatment with a filter can be mentioned. Moreover, it is also preferable that two or more kinds of raw materials are mixed, then filtered with a filter, and mixed with other raw materials (may or may not be filtered). As one more preferred embodiment thereof, an embodiment in which raw materials (preferably, all raw materials) contained in the composition for forming an underlayer film are mixed, and then subjected to a filtration treatment with a filter is exemplified.

Effects of filtration are exhibited even with one stage of a filter, but filtration with two or more stages of filters is more preferable. The filtration with two or more stages of filters refers to filtration in a state where two or more filters are arranged in series. In the present invention, filtration with one to five stages of filters is preferable, filtration with one to four stages of filters is more preferable, and filtration with two to four stages of filters is still more preferable.

The method for producing the composition for forming an underlayer film according to the embodiment of the present invention includes mixing raw materials for the composition for forming an underlayer film and then filtering the mixture with two or more kinds of filters, and it is preferable that pore diameters of at least two kinds among the two or more kinds of filters are different from each other. With such a configuration, impurities can be more effectively removed. Moreover, it is preferable that materials for at least two kinds among the two or more kinds of filters are different from each other. With such a configuration, much more kinds of impurities can be removed. Furthermore, it is preferable to perform filtration by passing the composition for forming an underlayer film through filters in order from a filter having the largest pore diameter among the two or more kinds of filters. That is, it is preferable to arrange the filters so that pore diameters are decreased from the upstream to the downstream of a filtration device, from the viewpoint of an impurities removal function.

In a case where two kinds of filters having different pore diameters are used, a filter having a pore diameter of 0.5 to 15 nm (preferably, a filter having a pore diameter of 1 to 10 nm) can be used in first-stage filtration, and a filter having a pore diameter of 3 to 100 nm (preferably, a filter having a pore diameter of 5 to 50 nm) can be used in second-stage filtration.

A component (material component) constituting the material for the filter preferably includes a resin. The resin is not particularly limited, and resins well known as the material for the filter can be used. Specific examples thereof include polyamide such as 6-polyamide and 6,6-polyamide, polyolefin such as polyethylene and polypropylene, polystyrene, polyimide, polyamide imide, poly(meth)acrylate, polyfluorocarbon such as polytetrafluoroethylene, perfluoroalkoxy alkane, a perfluoroethylenepropene copolymer, an ethylene-tetrafluoroethylene copolymer, an ethylene-chlorotrifluoroethylene copolymer, polychlorotrifluoroethylene, polyvinylidene fluoride, and polyvinyl fluoride, polyvinyl alcohol, polyester, cellulose, cellulose acetate, polysulfone, and polyether sulfone. Among them, from the viewpoint of having superior solvent resistance and a superior defect inhibition performance, at least one kind selected from the group consisting of polyethylene (including polyethylene having an ultra-high-molecular-weight and grafted polyethylene) and polyamide is even more preferable, and a filter consisting of polyamide is further still more preferable. These polymers can be used alone or in combination of two or more kinds thereof <Surface Free Energy of Underlayer Film>

Surface free energy of an underlayer film, which is formed of the composition for forming an underlayer film according to the embodiment of the present invention, is preferably 30 mN/m or greater, more preferably 40 mN/m or greater, and still more preferably 50 mN/m or greater. The upper limit thereof is preferably 200 mN/m or greater, more preferably 150 mN/m or greater, and still more preferably 100 mN/m or greater. The surface free energy can be measured at 23° C. using a surface tensiometer SURFACE TENS-IOMETER CBVP-A3 manufactured by Kyowa Interface Science Co., LTD. and a glass plate.

<Composition for Forming Pattern>

The composition for forming an underlayer film according to the embodiment of the present invention is usually used as a composition for forming an underlayer film for the composition for forming a pattern. The composition or the like of the composition for forming a pattern is not particularly specified, but the composition for forming a pattern preferably contains a polymerizable compound.

<<Polymerizable Compound>>

The composition for forming a pattern preferably contains a polymerizable compound, and it is more preferable that the polymerizable compound constitutes the maximum-amount component. The polymerizable compound may have one polymerizable group or two or more polymerizable groups in one molecule. At least one kind of polymerizable compounds contained in the composition for forming a pattern preferably has two to five polymerizable groups, more preferably has two to four polymerizable groups, still more preferably has two or three polymerizable groups, and even more preferably has three polymerizable groups, in one molecule. The polymerizable compound in the composition for forming a pattern preferably has the same kind of polymerizable group as the polymerizable group of the high-molecular-weight compound in the composition for forming an underlayer film. Consequently, the crosslinkable monomer can be bonded to the polymerizable compound in the composition for forming a pattern, and due to a bond across an interface between the compositions, an effect of further improving the adhesiveness at the interface can be achieved.

At least one kind of polymerizable compounds contained in the composition for forming a pattern preferably has a cyclic structure. Examples of this cyclic structure include the aliphatic hydrocarbon ring Cf and the aromatic hydrocarbon ring Cr. Among them, the polymerizable compound preferably has the aromatic hydrocarbon ring Cr and more preferably has a benzene ring.

A molecular weight of the polymerizable compound is preferably 100 to 900.

The at least one kind of polymerizable compounds is preferably represented by Formula (I-1).

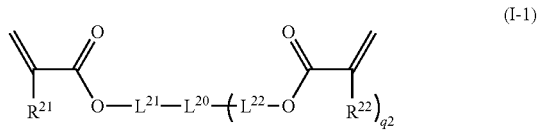

$L^{20}$ is a (1+q2)-valent linking group, and examples thereof include a linking group having a cyclic structure. Examples of the cyclic structure include examples of the ring Cf, the ring Cr, the ring Cn, the ring Co, and the ring Cs.

$R^{21}$ and $R^{22}$ each independently represent a hydrogen atom or a methyl group.

$L^{21}$ and $L^{22}$ each independently represent a single bond or the linking group L. $L^{20}$ and $L^{21}$ or $L^{22}$ may be bonded to each other via or without via the linking group L to form a ring. $L^{20}$, $L^{21}$, and $L^{22}$ may have the substituent T. A plurality of substituents T may be bonded to each other to form a ring. In a case where there are the plurality of substituents T, the plurality of substituents T may be the same as or different from each other.

q2 is an integer of 0 to 5, preferably an integer of 0 to 3, more preferably an integer of 0 to 2, and still more preferably 0 or 1.

Examples of the polymerizable compound include compounds used in the following Examples, the compounds described in paragraphs 0017 to 0024 and Examples of JP2014-090133A, the compounds described in paragraphs 0024 to 0089 of JP2015-009171A, the compounds described in paragraphs 0023 to 0037 of JP2015-070145A, and the compounds described in paragraphs 0012 to 0039 of WO2016/152597A, but the present invention is not construed as being limited thereto.

The content of the polymerizable compound in the composition for forming a pattern is preferably 30% by mass or greater, more preferably 45% by mass or greater, still more preferably 50% by mass or greater, and even more preferably 55% by mass or greater, and may be 60% by mass or greater or further 70% by mass or greater. Moreover, the upper limit value thereof is preferably less than 99% by mass and more preferably 98% by mass or less, and can also be 97% by mass or less.

It is preferable that the boiling point of the polymerizable compound is set based on a relationship with the high-molecular-weight compound contained in the aforementioned composition for forming an underlayer film and designed for formulation. The boiling point of the polymerizable compound is preferably 500° C. or lower, more preferably 450° C. or lower, and still more preferably 400° C. or lower. The lower limit value thereof is preferably 200° C. or higher, more preferably 220° C. or higher, and still more preferably 240° C. or higher.

<<Other Components>>

The composition for forming a pattern may contain additives other than the polymerizable compound. A polymerization initiator, a solvent, a surfactant, a sensitizer, a release agent, an antioxidant, a polymerization inhibitor, and the like may be contained as other additives.

In the present invention, a content of the solvent in the composition for forming a pattern is preferably 5% by mass or less, more preferably 3% by mass or less, and still more preferably 1% by mass or less, with respect to the composition for forming a pattern.

The composition for forming a pattern can also adopt an aspect in which a polymer (which has preferably a weight-average molecular weight of greater than 1,000 and more preferably a weight-average molecular weight of greater than 2,000) is not substantially contained. The expression "polymer is not substantially contained" means, for example, that the content of the polymer is 0.01% by mass or less with respect to the composition for forming a pattern, and it is preferable that the content is 0.005% by mass or less and more preferable that the polymer is not contained at all.

In addition, specific examples of the composition for forming a pattern, which can be used together with the composition for forming an underlayer film according to the embodiment of the present invention, include the compositions described in JP2013-036027A, JP2014-090133A, and JP2013-189537A, the contents of which are incorporated in the present specification. Moreover, also regarding preparation of the composition for forming a pattern and a pattern producing method, reference can be made to the descriptions in the aforementioned publications, the contents of which are incorporated in the present specification.

<Physical Property Value or the Like>

A viscosity of the composition for forming a pattern is preferably 20.0 mPa·s or lower, more preferably 15.0 mPa·s or lower, still more preferably 11.0 mPa·s or lower, and even more preferably 9.0 mPa·s or lower. The lower limit value of the viscosity is not particularly limited, but can be, for example, 5.0 mPa·s or higher. The viscosity is measured according to the following method.

The viscosity is measured using an E-type rotational viscometer RE85L manufactured by TOKI SANGYO CO., LTD. and a standard cone rotor (1° 34'×R24) in a state where a temperature of a sample cup is adjusted to 23° C. The unit is mPa·s. Other details regarding the measurement are in accordance with JIS Z 8803:2011. Two samples are produced for one level and are respectively measured three times. An arithmetic mean value of a total of six times is adopted as an evaluation value.

Surface tension (γResist) of the composition for forming a pattern is preferably 28.0 mN/m or higher and more preferably 30.0 mN/m or higher, and may be 32.0 mN/m or higher. By using the composition for forming a pattern which has high surface tension, a capillary force is increased and thus high-speed filling of a mold pattern with the composition for forming a pattern is possible. The upper limit value of the surface tension is not particularly limited, but from the viewpoints of a relationship with the underlayer film and imparting ink jet suitability, is preferably 40.0 mN/m or lower and more preferably 38.0 mN/m or lower, and may be 36.0 mN/m or lower.

The surface tension of the composition for forming a pattern is measured according to the same method as the measuring method for the alkylene glycol compound.

An Ohnishi parameter of the composition for forming a pattern is preferably 5.0 or less, more preferably 4.0 or less, and still more preferably 3.7 or less. The lower limit value of the Ohnishi parameter of the composition for forming a pattern is not particularly specified, but may be, for example, 1.0 or greater or further 2.0 or greater. For the solid contents in the composition for forming a pattern, the Ohnishi parameter of the composition for forming a pattern can be determined by substituting the number of carbon atoms, the number of hydrogen atoms, and the number of oxygen atoms in all the constituent components into the following expression.

Ohnishi parameter=sum of number of carbon atoms, number of hydrogen atoms, and number of oxygen atoms/(number of carbon atoms−number of oxygen atoms)

<Storage Container>

As a storage container of the composition for forming an underlayer film and the composition for forming a pattern, which are used in the present invention, storage containers well known in the related art can be used. Moreover, as the storage container, for the purpose of suppressing impurities from being mixed into a raw material or a composition, a multilayer bottle having a container inner wall made of six layers of six kinds of resins or a bottle having a seven-layer structure of six kinds of resins is also preferably used. Examples of such a container include the container described in JP2015-123351A.

<Kit for Imprinting>

A kit according to the embodiment of the present invention includes a combination of the composition for forming a pattern, which is for forming a pattern (cured film with a transferred pattern) by the imprinting method, and a composition for forming an underlayer film, which is for forming an underlayer film. For example, the composition for forming a pattern and the composition for forming an underlayer film are each stored in separate storage containers, and combined. By using the kit according to the embodiment of the present invention, an underlayer film having excellent film hardness can be formed, and as a result, imprinting capable of suppressing damage to the mold can be performed.

<Pattern Producing Method>

A pattern (cured film with a transferred pattern) producing method according to the preferred embodiment of the present invention includes: a step (underlayer film formation step) of forming an underlayer film on a surface of a substrate using the composition for forming an underlayer film according to the embodiment of the present invention; a step (step of forming a layer formed of the composition for forming a pattern) of applying the composition for forming a pattern onto the underlayer film (preferably, a surface of the underlayer film) to form a layer formed of the composition for forming a pattern; a step of bringing a mold into contact with the layer formed of the composition for forming a pattern; a step of exposing the layer formed of the composition for forming a pattern in a state of being in contact with a mold; and a step of peeling off the mold from the exposed layer formed of the composition for forming a pattern.

In the pattern producing method according to the embodiment of the present invention, the composition for forming an underlayer film is preferably preserved at 10° C. to 40° C. before being applied onto the substrate. The upper limit of the numerical range is more preferably 35° C. or lower and still more preferably 33° C. or lower. Moreover, the lower limit of the numerical range is more preferably 15° C. or higher and still more preferably 18° C. or higher. Consequently, the activity of the chelating agent can be sufficiently exerted.

Specific preservation methods other than the temperature are not particularly limited. For example, the composition can also be preserved under the atmosphere and can also be preserved under the atmosphere of a replacement gas such as nitrogen, and it is preferable to preserve the composition under the atmosphere. Moreover, the composition can also be preserved in a storage warehouse with a light shielding window, and may be preserved in a state of being mounted on an apparatus such as an imprint device.

Hereinafter, the pattern producing method will be described with reference to FIGS. 1A to 1G. It goes without saying that the configuration of the present invention is not limited by the drawings.

<<Underlayer Film Formation Step>>

Figure 1B:

In the underlayer film formation step, as shown in FIGS. 1A and 1B, an underlayer film 2 is formed on a surface of a substrate 1. The underlayer film is preferably formed by applying the composition for forming an underlayer film in a layer form onto the substrate. The substrate 1 may have an undercoat layer or a closely adhesive layer in addition to a case where the substrate 1 consists of a single layer.

A method for applying the composition for forming an underlayer film onto the surface of the substrate is not particularly specified, and generally well-known application methods can be adopted. Specific examples of the application method include a dip coating method, an air knife coating method, a curtain coating method, a wire bar coating method, a gravure coating method, an extrusion coating method, a spin coating method, a slit scanning method, and an ink jet method, and a spin coating method is preferable.

Furthermore, after the composition for forming an underlayer film is applied in a layer form onto the substrate, preferably, the solvent is volatilized (dried) by heat to form an underlayer film which is a thin film.

A thickness of the underlayer film 2 is preferably 2 nm or greater, more preferably 3 nm or greater, and still more preferably 4 nm or greater. Moreover, the thickness of the underlayer film is preferably 20 nm or less, more preferably 10 nm or less, and still more preferably 7 nm or less. By setting the film thickness to be equal to or greater than the lower limit value, extendability (wettability) of the composition for forming a pattern on the underlayer film is improved, and a uniform residual film can be formed after imprinting. By setting the film thickness to be equal to or less than the upper limit value, the thickness of the residual film after imprinting is reduced, the film thickness unevenness is less likely to occur, and thus uniformity of the residual film tends to be improved.

A material for the substrate is not particularly specified, and reference can be made to the description in paragraph 0103 of JP2010-109092A, the contents of which are incorporated in the present specification. In the present invention, a silicon substrate, a glass substrate, a quartz substrate, a sapphire substrate, a silicon carbide substrate, a gallium nitride substrate, an aluminum substrate, an amorphous aluminum oxide substrate, a polycrystalline aluminum oxide substrate, and a substrate made of spin-on carbon (SOC), spin-on glass (SOG), silicon nitride, silicon oxynitride, GaAsP, GaP, AlGaAs, InGaN, GaN, AlGaN, ZnSe, AlGa, InP, or ZnO can be mentioned. Furthermore, specific examples of a material for the glass substrate include aluminosilicate glass, aluminoborosilicate glass, and barium borosilicate glass. In the present invention, a silicon substrate and a substrate coated with spin-on carbon (SOC) are preferable.

As the silicon substrate, a surface-modified silicon substrate can be appropriately used, and a silicon substrate in which the carbon content in the region from the surface of the substrate to the thickness of 10 nm (more preferably, the thickness of 100 nm) is 70% by mass or greater (preferably, 80% to 100% by mass) may be used. Examples thereof include a substrate which has a spin-on carbon (SOC) film having a film thickness of 200 nm and is obtained by applying various spin-on carbon films onto a silicon substrate by a spin coating method and performing baking at 240° C. for 60 seconds. In recent years, stable mold patterning has been required even on the surfaces of such various SOC substrates, and according to the present invention, favorable adhesiveness between such a substrate and a layer formed of the composition for forming a pattern can be ensured, and stable mold patterning without substrate peeling is achieved.

In the present invention, it is preferable to use a substrate having an organic layer as an outermost layer.

Examples of the organic layer of the substrate include an amorphous carbon film formed by chemical vapor deposition (CVD), and a spin-on carbon film formed by dissolving a high-carbon material in an organic solvent and performing spin coating. Examples of the spin-on carbon film include a nortricyclene copolymer, a hydrogenated naphthol novolac resin, a naphthol dicyclopentadiene copolymer, a phenol dicyclopentadiene copolymer, the fluorene bisphenol novolac described in JP2005-128509A, the acenaphthylene copolymer described in JP2005-250434A, an indene copolymer, the fullerene having a phenol group described in JP2006-227391A, a bisphenol compound and a novolac resin thereof, a dibisphenol compound and a novolac resin thereof, a novolac resin of an adamantane phenol compound, a hydroxyvinylnaphthalene copolymer, the bisnaphthol compound and the novolac resin thereof described in JP2007-199653A, and resin compounds shown in ROMP and a tricyclopentadiene copolymerized substance.

For examples of the SOC, reference can be made to the description in paragraph 0126 of JP2011-164345A, the contents of which are incorporated in the present specification.

A contact angle of the surface of the substrate to water is preferably 20° or larger, more preferably 40° or larger, and still more preferably 60° or larger. The upper limit thereof is practically 90° or smaller. The contact angle is measured according to a method described in Example described later.

In the present invention, it is preferable to use a substrate (hereinafter, referred to as a basic substrate) having a basic layer as an outermost layer. Examples of the basic substrate include a substrate containing a basic organic compound (for example, an amine-based compound, an ammonium-based compound, or the like), and an inorganic substrate containing a nitrogen atom.

<<Step of Forming Layer Formed of Composition for Forming Pattern>>

Figure 1C:
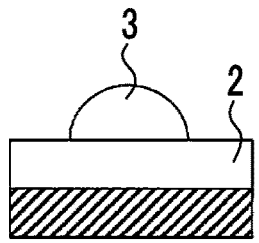

In this step, for example, as shown in FIG. 1C, a composition 3 for forming a pattern is applied onto the surface of the underlayer film 2.

A method for applying the composition for forming a pattern is not particularly specified, and reference can be made to the description in paragraph 0102 of JP2010-109092A (the publication number of the corresponding US application is US2011/183127A), the contents of which are incorporated in the present specification. The composition for forming a pattern is preferably applied onto the surface of the underlayer film by an ink jet method. Moreover, the composition for forming a pattern may be applied through multiple applying. In a method for arranging liquid droplets on the surface of the underlayer film by the ink jet method or the like, an amount of the liquid droplets is preferably about 1 to 20 pL, and the liquid droplets are preferably arranged on the surface of the underlayer film at an interval between liquid droplets. The interval between liquid droplets is preferably an interval of 10 to 1,000 μm. In a case of the ink jet method, the interval between liquid droplets is an arrangement interval between ink jet nozzles.

Furthermore, a volume ratio of the underlayer film 2 to the film-like composition 3 for forming a pattern applied onto the underlayer film is preferably 1:1 to 500, more preferably 1:10 to 300, and still more preferably 1:50 to 200.

In addition, a method for manufacturing a laminate is a method for manufacturing a laminate using the kit according to the embodiment of the present invention, and includes applying the composition for forming a pattern onto a surface of an underlayer film formed of the composition for forming an underlayer film. Moreover, it is preferable that the method for manufacturing a laminate includes a step of applying the composition for forming an underlayer film in a layer form onto a substrate, and includes heating (baking) the composition for forming an underlayer film, which has been applied in a layer form, preferably at 100° C. to 300° C., more preferably at 130° C. to 260° C., and still more preferably at 150° C. to 230° C. A heating time is preferably 30 seconds to 5 minutes.

In a case where the composition for forming a pattern is applied to the underlayer film, an aspect in which a liquid film is formed on the substrate may be adopted. The liquid film may be formed by a conventional method. For example, the liquid film may be formed by applying, onto a substrate, a composition containing a crosslinkable monomer (examples thereof include examples of the polymerizable compound), which is a liquid at 23° C., and the like.

<<Mold Contact Step>>

Figure 1D:
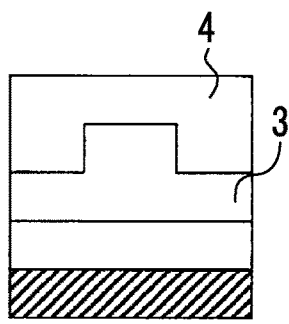

In the mold contact step, for example, as shown in FIG. 1D, the composition 3 for forming a pattern is brought into contact with a mold 4 having a pattern for transferring a pattern shape. Through such a step, a desired pattern (imprint pattern) is obtained.

Specifically, in order to transfer a desired pattern to the film-like composition for forming a pattern, the mold 4 is brought into press contact with the surface of the film-like composition 3 for forming a pattern.

The mold may be a light-transmitting mold or a non-light-transmitting mold. In a case where the light-transmitting mold is used, it is preferable that the composition 3 for forming a pattern is irradiated with light from a mold side. In the present invention, it is more preferable that the light-transmitting mold is used and light is radiated from the mold side.

A mold, which can be used in the present invention, is a mold having a pattern to be transferred. The pattern of the mold can be formed according to a desired processing accuracy, for example, by photolithography, an electron beam drawing method, or the like, but in the present invention, a mold pattern forming method is not particularly limited. Moreover, a pattern formed by the pattern producing method according to the preferred embodiment of the present invention can also be used as a mold.

A material constituting the light-transmitting mold used in the present invention is not particularly limited, but examples thereof include glass, quartz, a light-transmitting resin such as polymethyl methacrylate (PMMA) and a polycarbonate resin, a transparent metal vapor-deposited film, a flexible film such as polydimethylsiloxane, a photo-cured film, and a metal film, and quartz is preferable.

A non-light-transmission-type mold material used in a case where a light-transmitting substrate is used in the present invention is not particularly limited, but may be any material having a predetermined strength. Specific examples thereof include a ceramic material, a vapor-deposited film, a magnetic film, a reflective film, a substrate made of a metal such as Ni, Cu, Cr, and Fe, and a substrate made of SiC, silicon, silicon nitride, polysilicon, silicon oxide, or amorphous silicon, but there is no particular restriction.

The surface of the substrate may be appropriately treated by a conventional method, and for example, an aspect in which the adhesiveness is further improved by forming an OH group on the surface of the substrate by a UV ozone treatment or the like to increase polarity of the surface of the substrate may be adopted.

In the pattern producing method, in a case where imprint lithography is performed using the composition for forming a pattern, mold pressure is preferably set to 10 atm or lower. By setting the mold pressure to 10 atm or lower, the mold or the substrate is less likely to be deformed and thus the pattern accuracy tends to be improved. Moreover, also from the viewpoint that a device tends to be reduced in size due to low pressure, the above range is preferable. The mold pressure is preferably selected from a range in which uniformity of mold transfer can be ensured while the residual film of the composition for forming a pattern corresponding to a projection part of the mold is reduced.

In addition, it is also preferable that the contact between the composition for forming a pattern and the mold is performed under an atmosphere containing a helium gas, a condensable gas, or both a helium gas and a condensable gas.

<<Light Irradiation Step>>

In the light irradiation step, the exposure was performed by irradiating the composition for forming a pattern with light, to form a cured substance. An irradiation dose of light irradiation in the light irradiation step may be sufficiently larger than the minimum irradiation dose required for curing. The irradiation dose required for curing is appropriately determined by examining consumption of an unsaturated bond of the composition for forming a pattern or the like. A kind of light to be radiated is not particularly specified, but ultraviolet light is exemplified.

In addition, in the imprint lithography applied to the present invention, a temperature of the substrate during light irradiation is usually room temperature, but in order to increase reactivity, light irradiation may be performed while heating. Since setting a vacuum state as a stage prior to the light irradiation is effective in preventing air bubbles from being mixed, suppressing a decrease in reactivity due to oxygen mixing, and improving adhesiveness between the mold and the composition for forming a pattern, the light irradiation may be performed in a vacuum state. Moreover, in the pattern producing method, a preferred degree of vacuum during the light irradiation is in a range of 10' Pa to normal pressure.

During the exposure, exposure illuminance is preferably in a range of 1 to 500 mW/cm$^2$ and more preferably in a range of 10 to 400 mW/cm$^2$. An exposure time is not particularly limited, but is preferably 0.01 to 10 seconds and more preferably 0.5 to 1 second. An exposure amount is preferably in a range of 5 to 1,000 mJ/cm$^2$ and more preferably in a range of 10 to 500 mJ/cm$^2$.

In the pattern producing method, after the film-like composition for forming a pattern (pattern forming layer) is cured by the light irradiation, as necessary, a step of applying heat to the cured pattern to further cure the pattern may be included. A temperature for heating and curing the composition for forming a pattern after the light irradiation is preferably 150° C. to 280° C. and more preferably 200° C. to 250° C. Moreover, a time for applying heat is preferably 5 to 60 minutes and more preferably 15 to 45 minutes.

In a case where the composition for forming an underlayer film according to the embodiment of the present invention is used, due to the aforementioned light irradiation or heating, the crosslinking reaction between the polymerizable group of the high-molecular-weight compound in the underlayer film and the crosslinkable group of the crosslinkable monomer is promoted. Moreover, some of the crosslinkable groups of the crosslinkable monomer may also undergo the crosslinking reaction with the polymerizable compound in the composition for forming a pattern provided on the underlayer film, and the present invention also has an effect of further improving the adhesiveness at an interface between the compositions due to a bond across the interface, in addition to the effect of improving the film hardness of the underlayer film. In the imprint lithography, a temperature of the substrate during light irradiation is usually room temperature, but in order to increase reactivity, light irradiation may be performed while heating. Since setting a vacuum state as a stage prior to the light irradiation is effective in preventing air bubbles from being mixed, suppressing a decrease in reactivity due to oxygen mixing, and improving adhesiveness between the mold and the composition for forming a pattern, the light irradiation may be performed in a vacuum state. Moreover, in the pattern producing method, a preferred degree of vacuum during the light irradiation is in a range of 10' Pa to normal pressure.

<<Release Step>>

Figure 1E:
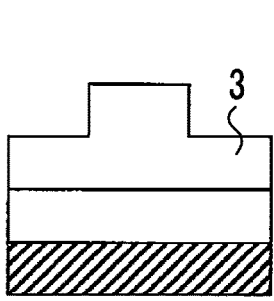

In the release step, the cured substance and the mold are separated from each other (FIG. 1E). The obtained pattern can be used for various uses as described later. That is, the present invention discloses a laminate further having the pattern formed of the composition for forming a pattern, on the surface of the underlayer film. Moreover, a film thickness of the pattern forming layer consisting of the composition for forming a pattern used in the present invention varies depending on intended uses, but is about 0.01 μm to 30 μm. Furthermore, as described later, etching or the like can also be performed.

<Pattern and Application Thereof>

The pattern formed by the pattern producing method can be used as a permanent film used in a liquid crystal display device (LCD) or the like, or an etching resist (mask for lithography) for manufacturing a semiconductor element. In particular, the present specification discloses a method for manufacturing a semiconductor device (circuit board), which includes a step of obtaining a pattern by the pattern producing method according to the preferred embodiment of the present invention. The method for manufacturing a semiconductor device according to the preferred embodiment of the present invention may further include a step of performing etching or ion implantation on the substrate using the pattern obtained by the pattern producing method as a mask and a step of forming an electronic member. The semiconductor device is preferably a semiconductor element. That is, the present specification discloses a method for manufacturing a semiconductor device, which includes the pattern producing method. Moreover, the present specification discloses a method for manufacturing an electronic apparatus, which includes a step of obtaining a semiconductor device by the method for manufacturing a semiconductor device and a step of connecting the semiconductor device and a control mechanism for controlling the semiconductor device.

In addition, a grid pattern is formed on a glass substrate of the liquid crystal display device using the pattern formed by the pattern producing method, and thus a polarizing plate having low reflection or absorption and a large screen size (for example, 55 inches or 60 inches (1 inch is 2.54 centimeters)) can be manufactured at low cost. For example, the polarizing plate described in JP2015-132825A or WO2011/132649A can be manufactured.

Figure 1F:
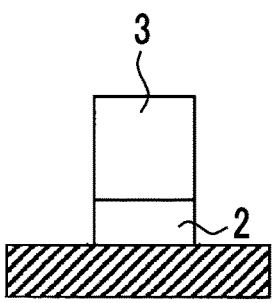
Figure 1G:

The pattern formed in the present invention is also useful as an etching resist (mask for lithography) as shown in FIGS. 1F and 1G. In a case where the pattern is used as an etching resist, first, a fine pattern of, for example, a nano or micron order is formed on the substrate by the pattern producing method. In the present invention, the pattern producing method is particularly advantageous in that a fine pattern of a nano order can be formed, and a pattern having a size of 50 nm or less and particularly 30 nm or less can also be formed. The lower limit value of the size of the pattern formed by the pattern producing method is not particularly specified, but can be, for example, 1 nm or greater.

Furthermore, the pattern producing method according to the embodiment of the present invention can also be applied to a method for manufacturing a mold for imprinting. The method for manufacturing a mold for imprinting includes, for example, a step of producing a pattern on a substrate (for example, a substrate consisting of a transparent material such as quartz), which is used as a material for a mold, by the aforementioned pattern producing method, and a step of performing etching on the substrate using the pattern.

By performing etching with an etchant such as hydrogen fluoride in a case where wet etching is used as the etching method, or with an etching gas such as $CF_4$ in a case where dry etching is used, a desired pattern can be formed on the substrate. The pattern has favorable etching resistance particularly to dry etching. That is, the pattern formed by the pattern producing method is preferably used as a mask for lithography.

Specifically, the pattern formed in the present invention can be preferably used for producing a recording medium such as a magnetic disc, a light-receiving element such as a solid-state imaging element, a light emitting element such as a light emitting diode (LED) and organic electroluminescence (organic EL), an optical device such as a liquid crystal display device (LCD), an optical component such as a diffraction grating, a relief hologram, an optical waveguide, an optical filter, and a microlens array, a member for flat panel display such as a thin film transistor, an organic transistor, a color filter, an antireflection film, a polarizing plate, a polarizing element, an optical film, and a column material, a nanobiodevice, an immunoassay chip, a deoxyribonucleic acid (DNA) separation chip, a microreactor, a photonic liquid crystal, or a guide pattern for fine pattern formation (directed self-assembly, DSA) using self-assembly of block copolymers.

EXAMPLES

Hereinafter, the present invention will be described in more detail with reference to Examples. The materials, the used amounts, the ratios, the treatment details, the treatment procedures, and the like shown in the following Examples can be appropriately modified without departing from the spirit of the present invention. Therefore, the scope of the present invention is not limited to the specific examples described below. In Examples, unless otherwise specified, "parts" and "%" are based on mass, and an environmental temperature (room temperature) in each step is 23° C.

<Preparation of Composition for Forming Underlayer Film>

Compounds shown in the following table were formulated in formulation ratios (parts by mass) shown in the following table, and mixed. After the mixing, the mixture was dissolved in propylene glycol monomethyl ether acetate (PGMEA) to produce a 0.3% by mass solution. The solution was filtered with a nylon filter having a pore diameter of 0.02 μm and an ultra-high-molecular-weight polyethylene (UPE) filter having a pore diameter of 0.001 μm to prepare compositions for forming an underlayer film shown in Examples and Comparative Examples.

Furthermore, a water content of the composition for forming an underlayer film of each of Examples and Comparative Examples was measured using the Karl Fischer method. For each composition, the water content was less than 0.1% by mass with respect to the total amount of the composition.

TABLE 1

|  |  | Example 1 | Example 2 | Example 3 | Example 4 | Example 5 | Example 6 | Example 7 |
|---|---|---|---|---|---|---|---|---|
| High-molecular-weight compound | A-1 | 0.28 | 0.23 |  |  |  | 1.12 |  |
|  | A-2 |  |  | 0.18 |  |  |  |  |
|  | A-3 |  |  |  |  |  |  |  |
|  | A-4 |  |  |  |  |  |  | 0.17 |
|  | A-5 |  |  |  |  | 0.28 |  |  |
|  | A-6 |  |  |  | 0.23 |  |  |  |
|  | A-7 |  |  |  |  |  |  |  |
|  | A-8 |  |  |  |  |  |  |  |
|  | A-9 |  |  |  |  |  |  |  |
| Crosslinkable monomer | B-1 | 0.12 |  |  |  | 0.12 | 0.48 | 0.23 |
|  | B-2 |  |  |  | 0.17 |  |  |  |
|  | B-3 |  | 0.17 |  |  |  |  |  |
|  | B-4 |  |  | 0.22 |  |  |  |  |
|  | B-5 |  |  |  |  |  |  |  |
|  | B-6 |  |  |  |  |  |  |  |
|  | B-7 |  |  |  |  |  |  |  |
| Solvent | PGMEA | 99.6 | 99.6 | 99.6 | 99.6 | 99.6 | 98.4 | 99.6 |
| Composition for forming pattern |  | V1 | V1 | V1 | V1 | V1 | V1 | V1 |
| Baking temperature (° C.) |  | 250 | 250 | 250 | 250 | 250 | 250 | 250 |
| Film thickness (nm) of underlayer film |  | 5 | 5 | 5 | 5 | 5 | 5 | 5 |
| ΔHSP |  | 2.50 | 2.50 | 2.10 | 3.78 | 0.90 | 2.50 | 2.10 |
| Distance between crosslinking points |  | 9, 17 | 25 | 30 | 11 | 9,17 | 9, 17 | 9, 17 |
| Film hardness |  | A | B | C | B | A | B | A |
| Coating defects |  | A | C | B | C | C | A | C |
| Releasability |  | A | B | B | B | B | C | A |
| Peeling defects |  | A | C | C | B | B | B | B |

|  |  | Example 8 | Example 9 | Example 10 | Example 11 | Example 12 | Comparative Example 1 | Comparative Example 2 |
|---|---|---|---|---|---|---|---|---|
| High-molecular-weight compound | A-1 |  |  |  | 0.28 |  |  |  |
|  | A-2 |  |  |  |  |  | 0.24 | 0.28 |
|  | A-3 | 0.2 |  |  |  |  |  |  |
|  | A-4 |  |  |  |  |  |  |  |
|  | A-5 |  |  |  |  |  |  |  |
|  | A-6 |  |  |  |  |  |  |  |
|  | A-7 |  | 0.26 |  |  |  |  |  |
|  | A-8 |  |  | 0.19 |  |  |  |  |
|  | A-9 |  |  |  |  | 0.235 |  |  |
| Crosslinkable monomer | B-1 |  |  |  | 0.12 |  | 0.16 |  |
|  | B-2 |  |  |  |  |  |  |  |
|  | B-3 |  |  |  |  |  |  |  |
|  | B-4 |  |  |  |  |  |  |  |
|  | B-5 | 0.2 | 0.14 | 0.21 |  |  |  |  |
|  | B-6 |  |  |  |  | 0.165 |  |  |
|  | B-7 |  |  |  |  |  |  | 0.12 |
| Solvent | PGMEA | 99.6 | 99.6 | 99.6 | 99.6 | 99.6 | 99.6 | 99.6 |
| Composition for forming pattern |  | V1 | V1 | V1 | V2 | V1 | V1 | V1 |
| Baking temperature (° C.) |  | 250 | 250 | 250 | 250 | 250 | 250 | 250 |
| Film thickness (nm) of underlayer film |  | 5 | 5 | 5 | 5 | 5 | 5 | 5 |
| ΔHSP |  | 3.26 | 4.50 | 3.13 | 2.50 | 3.76 | 5.40 | 3.16 |
| Distance between crosslinking points |  | 8 | 8 | 8 | 9, 17 | 16 | 9, 17 | 6 |

TABLE 1-continued

| Film hardness | B | C | C | A | B | D | D |
|---|---|---|---|---|---|---|---|
| Coating defects | A | B | B | A | B | D | C |
| Releasability | B | C | C | A | B | C | B |
| Peelingdefects | B | C | C | A | B | D | B |

Regarding the column of Distance between crosslinking points in Table 1, the monomer B-1 shows that a combination of a plurality of polymerizable groups and crosslinkable groups having distances between crosslinking points of 9 and 17, respectively, is present.

The specific specifications of each raw material are as follows.

<Raw Materials for Composition for Forming Underlayer Film>

<<High-Molecular-Weight Compound>>

A-1: Compound having the following structure (Mw=20,000).

A-2: Compound having the following structure (Mw=20,000 and Mw/Mn=1.9).

A-3: Compound having the following structure (Mw=20,000 and Mw/Mn=1.8).

A-4: Compound having the following structure (Mw=3,000).

A-5: Compound having the following structure (EBE-CRYL 3605, produced by DAICEL-ALLNEX LTD., and Mw=20,000).

A-6: Compound having the following structure (PVEEA, produced by NIPPON SHOKUBAI CO., LTD., Mw=21,000, and Mw/Mn=2.2).

A-7: Compound having the following structure (EA OLIGO 7420, produced by SHIN-NAKAMURA CHEMICAL CO., LTD., and Mw=3,500).

A-8: Compound having the following structure (Mw=21,000 and Mw/Mn=2.0).

A-9: Compound having the following structure (Mw=21,000 and Mw/Mn=2.0).

The numerical value attached to each repeating unit indicates a molar ratio of a repeating unit.

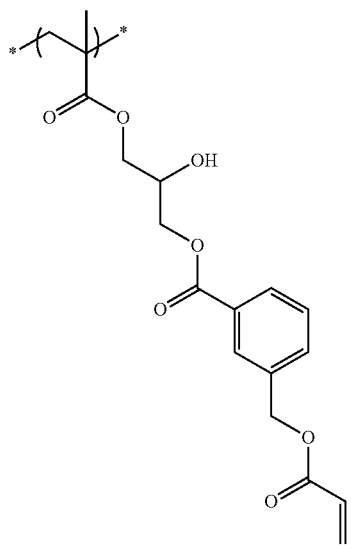

A-1

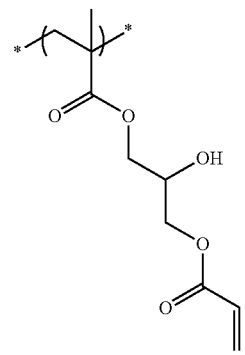

A-2

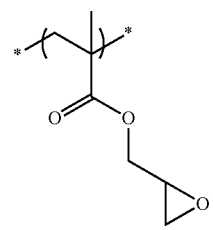

A-3

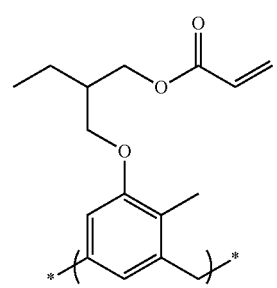

A-4

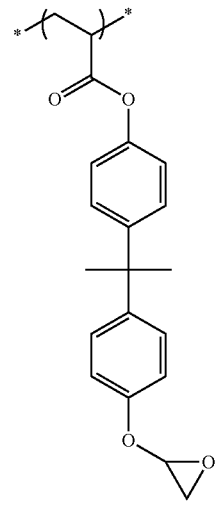

A-5

A-6

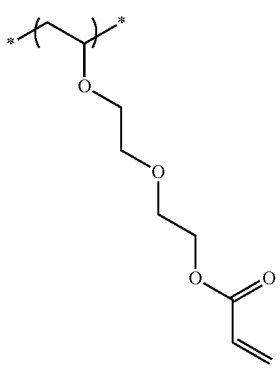

A-7

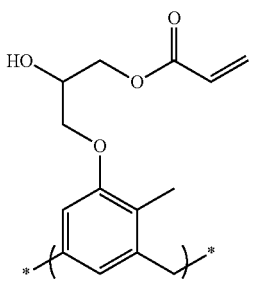

A-8

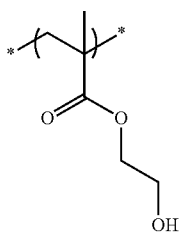

A-9

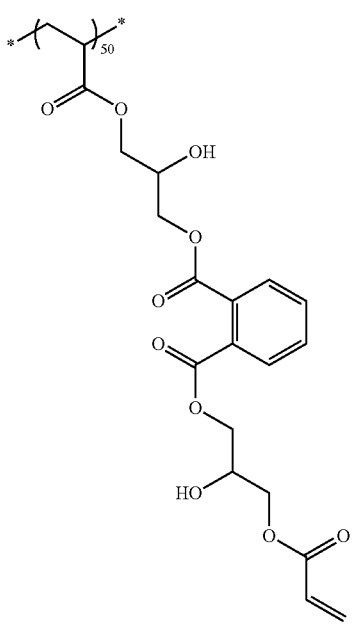

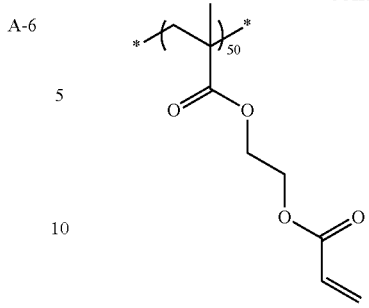

<<<Method for Synthesizing High-Molecular-Weight Compounds>>>

A-1:
The A-1 was synthesized according to the following method for synthesizing the high-molecular-weight compound A-9. For the obtained high-molecular-weight compound A-1, the Mw was 20,000.

A-2:
100 g of PGMEA as a solvent was placed in a flask, and a temperature of the PGMEA was raised to 90° C. under a nitrogen atmosphere. A liquid mixture of glycidyl methacrylate (GMA, 28.4 g, and 0.2 mol), an azo-based polymerization initiator (V-601, produced by FUJIFILM Wako Pure Chemical Corporation, 2.8 g, and 12 mmol), and PGMEA (50 g) was added dropwise to this solvent over 2 hours. After completion of the dropwise addition, the liquid mixture was stirred at 90° C. for 4 hours. Thereafter, acrylic acid (19.0 g, 0.26 mol, 1.1 equivalents with respect to GMA, and produced by FUJIFILM Wako Pure Chemical Corporation), tetrabutylammonium bromide (TBAB and 2.1 g), and 4-hydroxy-2,2,6,6-tetramethylpiperidine-1-oxyl (4-HO-TEMPO and 50 mg) were added in this order to the container, and reacted while stirring at 90° C. for 8 hours. It was confirmed by H-NMR measurement that a glycidyl group disappeared by the reaction. By the aforementioned procedures, a PGMEA solution of the high-molecular-weight compound A-2 was obtained. For the obtained high-molecular-weight compound A-2, the Mw was 20,000 and the dispersity (Mw/Mn) was 1.9.

A-3:
100 g of PGMEA as a solvent was placed in a flask, and a temperature of the PGMEA was raised to 90° C. under a nitrogen atmosphere. A liquid mixture of glycidyl methacrylate (GMA, 28.4 g, and 0.2 mol), an azo-based polymerization initiator (V-601, produced by FUJIFILM Wako Pure Chemical Corporation, 2.8 g, and 12 mmol), and PGMEA (50 g) was added dropwise to this solvent over 2 hours. After completion of the dropwise addition, the liquid mixture was stirred at 90° C. for 4 hours. By the aforementioned procedures, a PGMEA solution of the high-molecular-weight compound A-3 was obtained. For the obtained high-molecular-weight compound A-3, the Mw was 20,000 and the dispersity (Mw/Mn) was 1.8.

A-4:
11 g of EPON Resin 164 and 100 mL of dimethyl ether (DME) were mixed at room temperature to prepare a first solution, which was cooled to −20° C. Next, 50 mmol of ethylmagnesium bromide (EtMgBr) was dissolved in 50 mL of DME to prepare a second solution, the second solution was added to the first solution, and then stirring was performed for 6 hours. Then, the reaction was then stopped by adding 5 mL of water to the first solution. Moreover, the temperature of the first solution was returned to room temperature, water was removed, then acrylic acid chloride (450 mg and 5 mmol) and trimethylamine (10 mmol) were added to the first solution, and the reaction mixture was stirred for 2 hours. Solid matter was removed through filtration, and then filtrate was vacuum-dried. A product was redissolved in 200 ml of diethyl ether, a potassium carbonate solid (10 g) was added to this solution, and the remaining acid was absorbed while stirring for 4 hours. Thereafter, solid matter was removed through filtration, and filtrate was vacuum-dried to obtain the high-molecular-weight compound A-4. For the obtained high-molecular-weight compound A-4, the Mw was 3,000.

A-8:

The A-8 was synthesized by polymerizing 2-hydroxyethyl methacrylate according to the following method for synthesizing the high-molecular-weight compound A-9. For the obtained high-molecular-weight compound A-8, the Mw was 21,000 and the Mw/Mn was 2.0.

A-9:

PGME (45.38 g) was added to a three-neck flask with $N_2$ flow, and heated to 90° C. 2-Hydroxyethyl methacrylate (produced by Tokyo Chemical Industry Co., Ltd., 13.01 g, 100.0 mmol), glycidyl methacrylate (produced by NOF CORPORATION, 14.22 g, 100.0 mmol), and a azo-based polymerization initiator (produced by FUJIFILM Wako Pure Chemical Corporation, V-601, 0.92 g, 4.0 mmol) were dissolved in separate PGME (45.38 g), the obtained mixture was added dropwise to the flask over 2 hours at the internal temperature of the flask, which was not higher than 95° C., and the resultant was further aged at 90° C. for 4 hours. Thereafter, the flask was cooled to 25° C. to obtain a reaction solution. Diisopropyl ether (435.5 g) and hexane (186.6 g) were added to another three-neck flask, and mixed, and this mixed solution was cooled to 0° C. and stirred. Moreover, the reaction solution was added dropwise to this mixed solution over 30 minutes at a temperature, which was not higher than 5° C., and the mixture was further stirred for 1 hour. Subsequently, this mixed solution was left to stand for 1 hour, and filtered under reduced pressure. The obtained filtration substance was dried under reduced pressure to obtain a target compound (intermediate G-1A).

PGME (45.38 g), the intermediate G-1A (13.61 g, 100.0 mmol), and triethylamine (produced by Tokyo Chemical Industry Co., Ltd., 7.59 g, 75.0 mmol) were added to a three-neck flask with $N_2$ flow, and cooled to 0° C. A solution obtained by mixing PGME (45.38 g) with acryloyl chloride (5.43 g, 60.0 mmol) was added dropwise to the flask over 2 hours at the internal temperature of the flask, which was not higher than 10° C., and the resultant was further aged at 20° C. for 4 hours. Thereafter, the flask was cooled to 0° C. to obtain a reaction solution. Diisopropyl ether (435.5 g) and hexane (186.6 g) were added to another three-neck flask, and mixed, and this mixed solution was cooled to 0° C. and stirred. Moreover, the reaction solution was added dropwise to this mixed solution over 30 minutes at a temperature, which was not higher than 5° C., and the mixture was further stirred for 1 hour. Subsequently, this mixed solution was left to stand for 1 hour, and filtered under reduced pressure. The obtained filtration substance was washed with water and dried under reduced pressure to obtain a target compound (intermediate G-1B).

PGMEA (45.38 g), phthalic acid (produced by Tokyo Chemical Industry Co., Ltd., 16.61 g, 100.0 mmol), glycidyl acrylate (produced by NOF CORPORATION, 2.56 g, 20.0 mmol), tetraethylammonium bromide (produced by Tokyo Chemical Industry Co., Ltd., 0.21 g, 1.0 mmol), and 4-OH-TEMPO (produced by Tokyo Chemical Industry Co., Ltd., 1.72 mg, 0.01 mmol) were added to a three-neck flask with $N_2$ flow, and aged at 90° C. for 8 hours. Thereafter, ethyl acetate (800 mL) and distilled water (500 mL) were added to the flask, and liquid separation was performed. An aqueous layer after this liquid separation was removed, a 1% $NaHCO_3$ aqueous solution (500 mL) was added, and liquid separation was further performed. Moreover, an aqueous layer after this liquid separation was removed, 500 mL of distilled water was added, and liquid separation was further performed. Subsequently, an organic layer after this liquid separation was concentrated and purified by silica gel chromatography to obtain a target compound (intermediate G-1C).

PGMEA (45.38 g), the intermediate G-1B, the intermediate G-1C, and tetraethylammonium bromide (produced by Tokyo Chemical Industry Co., Ltd., 0.21 g, 1.0 mmol), and 4-OH-TEMPO (produced by Tokyo Chemical Industry Co., Ltd., 1.72 mg, 0.01 mmol) were added to a three-neck flask with $N_2$ flow, and aged at 90° C. for 8 hours. Thereafter, the resultant was cooled to 25° C. to obtain a reaction solution. Diisopropyl ether (435.5 g) and hexane (186.6 g) were added to another three-neck flask, and mixed, and this mixed solution was cooled to 0° C. and stirred. Moreover, the reaction solution was added dropwise to this mixed solution over 30 minutes at a temperature, which was not higher than 5° C., and the mixture was further stiffed for 1 hour. Subsequently, this mixed solution was left to stand for 1 hour, and filtered under reduced pressure. The obtained filtration substance was dried under reduced pressure to obtain the high-molecular-weight compound A-9 as a final product. For the obtained high-molecular-weight compound A-9, the Mw was 21,000 and the Mw/Mn was 2.0.

<<Crosslinkable Monomer>>

B-1: Compound having the following structure (distance between crosslinking points: 9 or 17).

B-2: Compound having the following structure (ΔDCP, produced by SHIN-NAKAMURA CHEMICAL CO., LTD., and distance between crosslinking points: 11).

B-3: Compound having the following structure (A-BPE-4, produced by SHIN-NAKAMURA CHEMICAL CO., LTD., and distance between crosslinking points: 25).

B-4: Compound having the following structure (A-200, produced by SHIN-NAKAMURA CHEMICAL CO., LTD., and distance between crosslinking points: 30).

B-5: Compound having the following structure (diglycidyl 4-cyclohexene-1,2-dicarboxylate, produced by Tokyo Chemical Industry Co., Ltd., and distance between crosslinking points: 8).

B-6: Compound having the following structure (distance between crosslinking points: 16).

B-7: Compound having the following structure (distance between crosslinking points: 6).

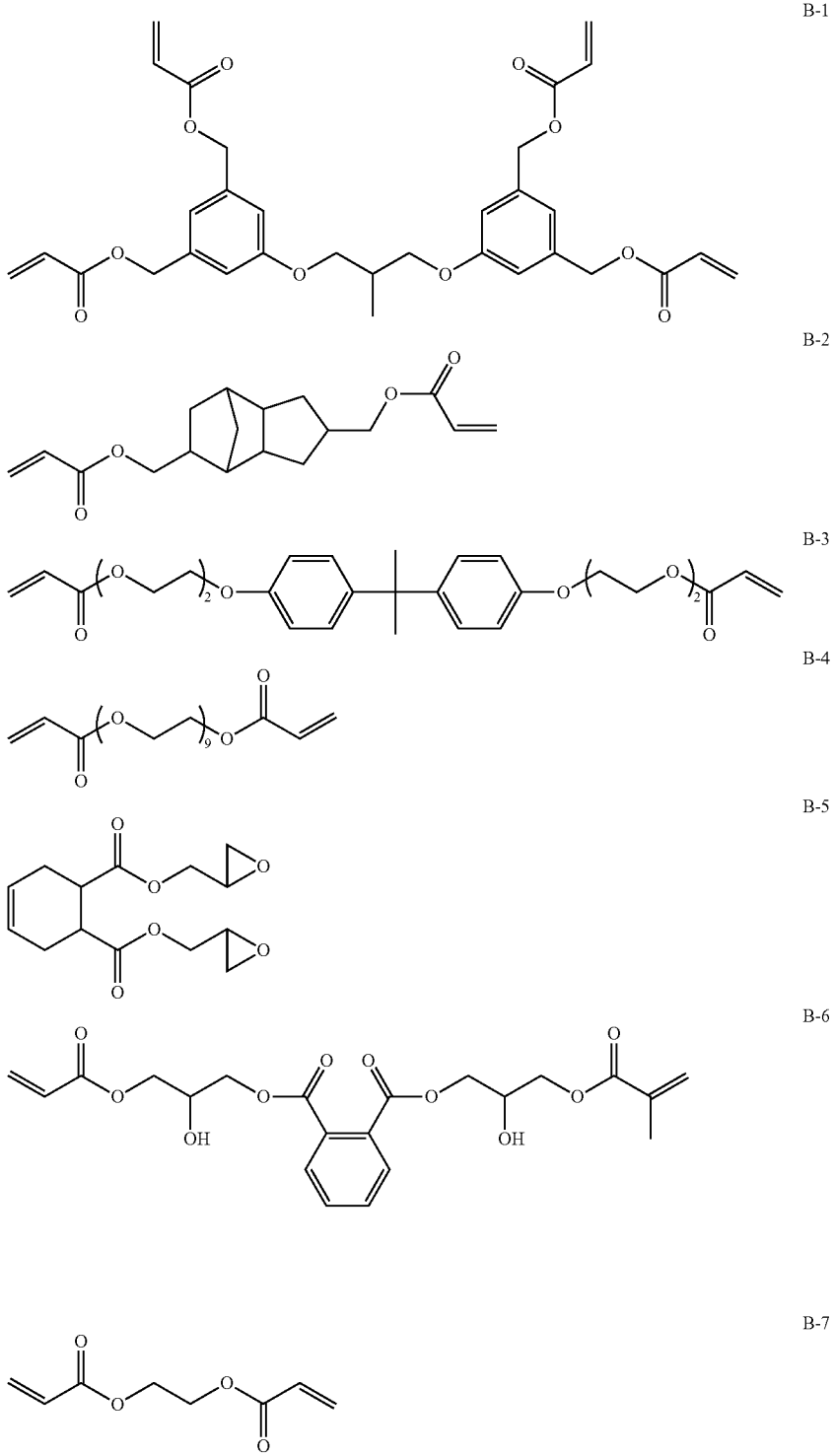

<<Solvent>>

PGMEA: Propylene glycol monomethyl ether acetate

<Preparation of Composition for Forming Pattern>

Preparation was performed by formulating compounds shown in Table 2 below in formulation ratios (parts by mass) shown in the following table, and further adding 4-hydroxy-2,2,6,6-tetramethylpiperidine-1-oxyl free radical (produced by Tokyo Chemical Industry Co., Ltd.) as a polymerization inhibitor so that the amount thereof was 200 ppm by mass (0.02% by mass) with respect to the total amount of polymerizable compounds (Nos. 1 to 3 in Table 2). The resultant was filtered with a nylon filter having a pore diameter of 0.02 μm and a UPE filter having a pore diameter of 0.001 μm to prepare compositions V1 and V2 for forming a pattern. In the table, k+m+n is 10.

TABLE 2

| | Composition V1 for forming pattern | | Composition V2 for forming pattern | |
|---|---|---|---|---|
| No. | Compound | Formulation ratio (parts by mass) | Compound | Formulation ratio (parts by mass) |
| 1 | 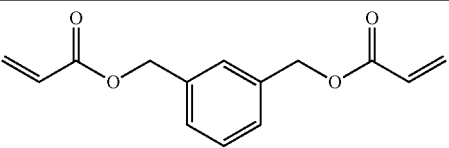 | 65 | 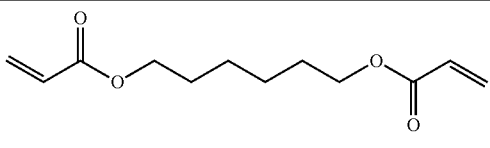 | 50 |
| 2 | 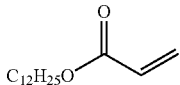 | 20 | 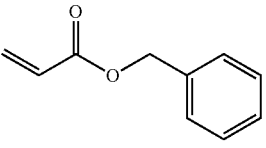 | 40 |
| 3 | 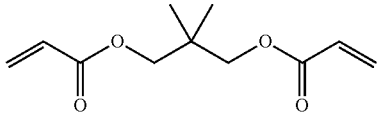 | 15 | 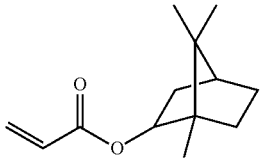 | 10 |
| 4 | 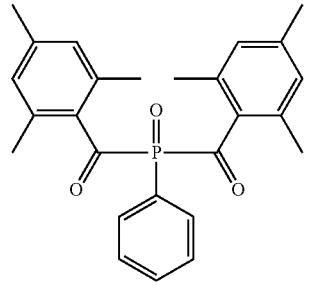 [SMILES: Cc1cc(C)c(C(=O)P(=O)(C(=O)c2c(C)cc(C)cc2C)c2ccccc2)c(C)c1] | 2 | 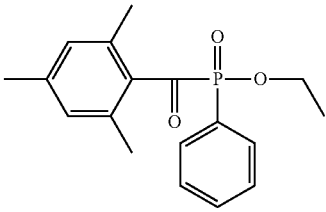 [SMILES: CCOP(=O)(C(=O)c1c(C)cc(C)cc1C)c1ccccc1] | 1 |
| 5 | 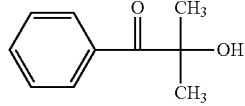 | 2 | 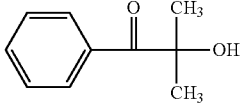 | 2 |
| 6 | 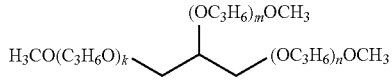 | 3 | Fluorine-based surfactant Capstone PS-3100 (produced by DuPont) | 2 |

<Calculation of Hansen Solubility Parameter Distance (ΔHSP)>

For each compound of the high-molecular-weight compound and the crosslinkable monomer according to Examples and Comparative Examples, the Hansen solubility parameter and the boiling point were calculated using HSP calculation software HSPiP. Specifically, in a case of the high-molecular-weight compound, respective components (d component, p component, and h component) of the Hansen solubility parameter vector were calculated by inputting a structural formula of a monomer unit constituting the high-molecular-weight compound in a SMILES format into the above software. In a case where the high-molecular-weight compound is a copolymer having a plurality of monomer units, the respective components were calculated by the calculation method using Expression (2). Meanwhile, in a case of the crosslinkable monomer, the respective components of the Hansen solubility parameter vector were calculated by inputting a molecular formula of the crosslinkable monomer in a SMILES format into the above software. The Hansen solubility parameter distance (ΔHSP) was calculated by determining ΔD, ΔP, and ΔH, respectively, from respective components (d component, p component, and h component) of a Hansen solubility parameter of the corresponding component and applying ΔD, ΔP, and ΔH to Expression (1). Moreover, temperature conditions during the formation of the underlayer film were set in consideration of the boiling point calculated by the same software.

<Formation of Underlayer Film and Measurement of Film Thickness>

A silicon wafer was spin-coated with the composition for forming an underlayer film of each of Examples and Comparative Examples, and heated using a hot plate under the baking temperature conditions shown in Table 1 to form an underlayer film on the silicon wafer. A film thickness of the underlayer film was measured by an ellipsometer.

<Evaluation>

For the composition for forming an underlayer film of each of Examples and Comparative Examples obtained above, the following items were evaluated.

<<Evaluation of Film Hardness>>

The film hardness of the underlayer film was evaluated based on the magnitude of an adhesive force in a case where the aggregation breakage of the underlayer film occurred. A specific method thereof is as follows. The composition (V1 or V2) for forming a pattern which is shown in the table and of which the temperature was adjusted to 25° C. according to each of Examples and Comparative Examples was jetted in a liquid droplet amount of 6 pl per nozzle to the surface of the underlayer film obtained above using an ink jet printer DMP-2831 manufactured by FUJIFILM Dimatix Inc., and liquid droplets were applied onto the underlayer film in a square array with intervals of about 100 μm, thereby forming a pattern forming layer. Subsequently, a quartz wafer spin-coated with the composition for forming a closely adhesive layer described in Example 6 of JP2014-024322A was pressed against the pattern forming layer under a He atmosphere (substitution rate of 90% or greater) to imprint the composition for forming a pattern. When 10 seconds passed after the imprinting, exposure was performed from the quartz wafer side using a high-pressure mercury lamp under a condition of 150 mJ/cm². Moreover, a force required for separating the laminate after exposure was measured, and defined as an adhesive force F of the underlayer film. Further, in all cases, the separation at this time was caused by the aggregation breakage inside the underlayer film. Furthermore, the value of F was evaluated according to the following standards. The evaluations of A to C are levels suitable for practical use.

A: 30 N≤F
B: 25 N≤F<30 N
C: 20 N≤F<25 N
D: F<20N

<<Evaluation of Coating Defects>>

A silicon wafer having a diameter of 300 mm was prepared, and particles having a diameter of 50 nm or greater and present on the wafer were detected by a device (SP-5 manufactured by KLA-Tencor Corporation) for detecting defects on the surface of the wafer. This is used as an initial value. Subsequently, the silicon wafer was spin-coated with the composition for forming an underlayer film of each of Examples and Comparative Examples, and heated using a hot plate under the temperature conditions shown in the table to form an underlayer film on the silicon wafer. Next, the number of defects was measured in the same manner as above. This is used as a measured value. Moreover, a difference (measured value—initial value) between the initial value and the measured value was calculated, and the results thereof were evaluated based on the following standards. The evaluations of A to C are levels suitable for practical use.

A: The difference between the initial value and the measured value was 20 or less.
B: The difference between the initial value and the measured value was 21 to 100.
C: The difference between the initial value and the measured value was 101 to 500.
D: The difference between the initial value and the measured value was 501 or more.

<<Evaluation of Releasability>>

An underlayer film was formed on a silicon wafer according to the aforementioned method for forming an underlayer film. The composition (V1 or V2) for forming a pattern which is shown in the table and of which the temperature was adjusted to 25° C. according to each of Examples and Comparative Examples was jetted in a liquid droplet amount of 6 pl per nozzle to the surface of this underlayer film using an ink jet printer DMP-2831 manufactured by FUJIFILM Dimatix Inc., and liquid droplets were applied onto the underlayer film in a square array with intervals of about 100 μm, thereby forming a pattern forming layer. Subsequently, a mold was pressed against the pattern forming layer under a He atmosphere (substitution rate of 90% or greater), and the pattern of the mold was filled with the composition for forming a pattern. The used mold is a quartz mold with a line/space pattern having a line width of 20 nm, a depth of 55 nm, and a pitch of 60 nm. When 10 seconds passed after the imprinting, exposure was performed from a mold side using a high-pressure mercury lamp under a condition of 100 mJ/cm², and then the mold was peeled off to transfer a pattern to the pattern forming layer.

In this pattern transfer, a force (releasing force F, unit: N) required for releasing the mold was measured. The releasing force was measured according to the method of Comparative Example described in paragraphs 0102 to 0107 of JP2011-206977A, and the results thereof were evaluated based on the following standards. The evaluations of A to C are levels suitable for practical use.

A: F≤15 N
B: 15 N<F≤18N
C: 18 N<F≤20 N
D: 20 N<F

<<Evaluation of Peeling Defects>>

An underlayer film was formed on a silicon wafer according to the aforementioned method for forming an underlayer film. The composition (V1 or V2) for forming a pattern which is shown in the table and of which the temperature was adjusted to 25° C. according to each of Examples and Comparative Examples was jetted in a liquid droplet amount of 6 pl per nozzle to the surface of this underlayer film using an ink jet printer DMP-2831 manufactured by FUJIFILM Dimatix Inc., and liquid droplets were applied onto the underlayer film in a square array with intervals of about 100 μm, thereby forming a pattern forming layer. Subsequently, a mold was pressed against the pattern forming layer under a He atmosphere (substitution rate of 90% or greater), and the pattern of the mold was filled with the composition for forming a pattern. The used mold is a quartz mold with a line/space pattern having a line width of 28 nm, a depth of 60 nm, and a pitch of 60 nm. When 10 seconds passed after the imprinting, exposure was performed from a mold side using a high-pressure mercury lamp under a condition of 150 mJ/cm², and then the mold was peeled off to transfer a pattern to the pattern forming layer.

The presence or absence of peeling of the transferred pattern was checked by optical microscope observation (macro-observation) and scanning electron microscope observation (micro-observation), and the results thereof were evaluated based on the following standards. The evaluations of A to C are levels suitable for practical use.

A: Pattern peeling was not observed.
B: In the macro-observation, pattern peeling was not observed, but in the micro-observation, pattern peeling was observed.
C: In the macro-observation, peeling was observed in some regions (release end part).
D: None of A to C were applicable.

<Evaluation Result>

The evaluation results of the respective Examples and Comparative Examples are shown in Table 1. From the results, it was found that by using the composition for forming an underlayer film according to the embodiment of the present invention, an underlayer film having excellent film hardness can be formed even in a case where the high-molecular-weight component and the monomer component are mixed. Moreover, according to the present invention, it was also found that the composition for forming an underlayer film contributes to a reduction in particles and the improvement in the coated surface condition, after the application of the composition.

In addition, the underlayer film was formed on the silicon wafer using the composition for forming an underlayer film according to each Example, and a predetermined pattern corresponding to a semiconductor circuit was formed on the silicon wafer with the underlayer film using the composition for forming a pattern according to each Example. Moreover, each silicon wafer was etched by using this pattern as an etching mask, and each semiconductor element was produced using this silicon wafer. There was no problem with the performance of any of the semiconductor elements.

EXPLANATION OF REFERENCES

1: substrate
2: underlayer film
3: composition for forming pattern
4: mold

What is claimed is:

1. A composition for forming an underlayer film in an imprinting method, comprising:
    a high-molecular-weight compound having a polymerizable functional group; and
    a monomer having a plurality of crosslinking functional groups capable of being bonded to the polymerizable functional group,
    wherein a Hansen solubility parameter distance, which is a difference between a Hansen solubility parameter of the high-molecular-weight compound and a Hansen solubility parameter of the monomer, is 5.0 or less, and
    regarding two crosslinking functional groups among the plurality of crosslinking functional groups, the number of atoms, which constitute a shortest atom chain mutually linking crosslinking points in the respective crosslinking functional groups, is 7 or more.

2. The composition for forming an underlayer film according to claim 1,
    wherein at least one kind of the high-molecular-weight compound or the monomer has a ring structure.

3. The composition for forming an underlayer film according to claim 2,
    wherein both the high-molecular-weight compound and the monomer have a ring structure.

4. The composition for forming an underlayer film according to claim 2,
    wherein the ring structure contains an aromatic ring.

5. The composition for forming an underlayer film according to claim 1,
    wherein the Hansen solubility parameter distance is 3 or less.

6. The composition for forming an underlayer film according to claim 1,
    wherein the number of atoms constituting the atom chain is 7 to 20.

7. The composition for forming an underlayer film according to claim 1,
    wherein at least one kind of the polymerizable functional group or the plurality of crosslinking functional groups includes a group having an ethylenically unsaturated bond.

8. The composition for forming an underlayer film according to claim 1,
    wherein at least one kind of the high-molecular-weight compound or the monomer contains a hydrogen bonding group.

9. The composition for forming an underlayer film according to claim 1, further comprising a solvent,
    wherein a content of the solvent with respect to the composition for forming an underlayer film is 99% by mass or greater.

10. The composition for forming an underlayer film according to claim 1,
    wherein a molecular weight of the monomer is 200 to 1,000.

11. The composition for forming an underlayer film according to claim 1,
    wherein the high-molecular-weight compound includes at least one kind of an acrylic resin, a novolac resin, or a vinyl resin.

12. A kit for imprinting, comprising a combination of the composition for forming an underlayer film according to claim 1 and a composition for forming a pattern.

13. A pattern producing method comprising:
    forming an underlayer film on a substrate by using the composition for forming an underlayer film according to claim 1;
    applying a composition for forming a pattern onto the underlayer film;
    curing the composition for forming a pattern in a state of being in contact with a mold; and
    peeling off the mold from the composition for forming a pattern.

14. The pattern producing method according to claim 13,
    wherein a contact angle of the substrate to pure water is 60 degrees or larger.

15. The pattern producing method according to claim 13,
    wherein the forming of the underlayer film includes applying the composition for forming an underlayer film onto the substrate by a spin coating method.

16. The pattern producing method according to claim 13,
    wherein the applying of the composition for forming a pattern onto the underlayer film is performed by an ink jet method.

17. A laminate comprising:
    a substrate; and
    a layer formed of the composition for forming an underlayer film according to claim 1.

18. A method for manufacturing a semiconductor element,
    wherein a semiconductor element is manufactured using a pattern obtained by the producing method according to claim 13.

* * * * *